(12) United States Patent
Iwasaki et al.

(10) Patent No.: US 10,714,541 B2
(45) Date of Patent: Jul. 14, 2020

(54) ELECTRO-OPTICAL DEVICE, MANUFACTURING METHOD OF ELECTRO-OPTICAL DEVICE, AND ELECTRONIC APPARATUS

(71) Applicant: SEIKO EPSON CORPORATION, Tokyo (JP)

(72) Inventors: Masanori Iwasaki, Shiojiri (JP); Suguru Akagawa, Matsumoto (JP); Narumi Ishibashi, Shiojiri (JP); Takeshi Koshihara, Matsumoto (JP)

(73) Assignee: SEIKO EPSON CORPORATION, Tokyo (JP)

( * ) Notice: Subject to any disclaimer, the term of this patent is extended or adjusted under 35 U.S.C. 154(b) by 0 days.

(21) Appl. No.: 16/288,764

(22) Filed: Feb. 28, 2019

(65) Prior Publication Data

US 2019/0273122 A1   Sep. 5, 2019

(30) Foreign Application Priority Data

Mar. 1, 2018   (JP) .................................. 2018-036220

(51) Int. Cl.
*H01L 51/52* (2006.01)
*H01L 27/32* (2006.01)
*H01L 51/56* (2006.01)

(52) U.S. Cl.
CPC ........ *H01L 27/322* (2013.01); *H01L 27/3272* (2013.01); *H01L 51/524* (2013.01); *H01L 51/56* (2013.01); *H01L 27/3258* (2013.01); *H01L 51/5246* (2013.01); *H01L 51/5265* (2013.01); *H01L 51/5271* (2013.01); *H01L 51/5284* (2013.01); *H01L 2227/323* (2013.01); *H01L 2251/558* (2013.01)

(58) Field of Classification Search
CPC .......................... H01L 27/322; H01L 27/3272
See application file for complete search history.

(56) References Cited

U.S. PATENT DOCUMENTS

| | | | |
|---|---|---|---|
| 9,076,990 B2 * | 7/2015 | Nakamura | ............ H01L 27/322 |
| 10,181,500 B2 * | 1/2019 | Kim | .................... H01L 51/5253 |
| 2003/0001992 A1 * | 1/2003 | Kawase | ............... B41J 2/14233 349/106 |
| 2005/0057712 A1 * | 3/2005 | Katagami | ............. G02F 1/1362 349/114 |
| 2007/0064178 A1 * | 3/2007 | Murai | ............... G02F 1/133784 349/108 |
| 2014/0117334 A1 * | 5/2014 | Nakamura | ............ H01L 27/322 257/40 |
| 2014/0117842 A1 | 5/2014 | Hanamura | |
| 2017/0005144 A1 | 1/2017 | Akagawa et al. | |

FOREIGN PATENT DOCUMENTS

| | | |
|---|---|---|
| JP | 2014-089804 A | 5/2014 |
| JP | 2017-16822 A | 1/2017 |
| JP | 2018-125168 A | 8/2018 |

* cited by examiner

*Primary Examiner* — Nicholas J Tobergte
(74) *Attorney, Agent, or Firm* — Oliff PLC

(57) ABSTRACT

An electro-optical device includes a first substrate including a plurality of light-emitting elements and a color filter provided corresponding to the plurality of light-emitting elements and a second substrate being a light-transmissive substrate and disposed facing the first substrate with an adhesive provided between the first substrate and the second substrate. An adhesive surface of the color filter of the first substrate is provided with protrusions and recesses in a stripe pattern.

9 Claims, 16 Drawing Sheets

ELECTRO-OPTICAL DEVICE, MANUFACTURING METHOD OF ELECTRO-OPTICAL DEVICE, AND ELECTRONIC APPARATUS

BACKGROUND

1. Technical Field

The present invention relates to an electro-optical device, a manufacturing method of an electro-optical device, and an electronic apparatus.

2. Related Art

Organic electro-luminescence (EL) devices that include organic EL elements in pixels are known as electro-optical devices. Because organic EL elements can be made smaller and thinner than light-emitting diodes (LEDs), the use of organic EL elements in microdisplays such as head-mounted displays (HMDs) and electronic viewfinders (EVFs) is garnering attention.

For example, JP-A-2014-89804 proposes an organic EL device combining organic EL elements that emit white light with a color filter as means for realizing a color display in such a microdisplay. In the organic EL device of JP-A-2014-89804, a sealing layer is formed covering a plurality of organic EL elements disposed on a substrate, and a color filter constituted by blue (B), green (G), and red (R) coloring layers is formed on the sealing layer. The coloring layers that constitute the color filter are partitioned by protrusions on the sealing layer which are lower in height than the coloring layers. Compared to a configuration lacking such protrusions, the organic EL device of JP-A-2014-89804 reduces the percentage of emitted light from the organic EL element that, at the boundaries between the coloring layers, passes through coloring layers of colors aside from the coloring layer through which that light is originally supposed to pass. This is said to be capable of realizing excellent symmetry with respect to the visual field angle characteristics.

In the organic EL device disclosed in JP-A-2014-89804, an opposing substrate is arranged opposite the element substrate on which the organic EL elements and color filter are formed, with a transparent resin layer interposed between the element substrate and the opposing substrate, to protect the color filter. In other words, the organic EL device is configured by affixing the element substrate and the opposing substrate to each other with interposing the transparent resin layer.

However, if, for example, the thicknesses of the coloring layers are then adjusted to vary on a color-by-color basis to achieve desired optical characteristics, level differences will arise between the coloring layers. In such a case, there is a risk, when affixing the element substrate and the opposing substrate to each other, that the resin material will be unevenly applied when forming the transparent resin layer that covers the color filter of the element substrate, that bubbles will form at the areas of level differences between the coloring layers, or the like. Bubbles in particular will affect the display, and there is thus a need for improvement.

SUMMARY

An electro-optical device according to an aspect of the invention includes, a first substrate including a plurality of light-emitting elements and a color filter provided corresponding to the plurality of light-emitting elements, and a second substrate being a light-transmissive substrate and disposed facing the first substrate with an adhesive provided between the first substrate and the second substrate, wherein an adhesive surface of the color filter of the first substrate is provided with protrusions and recesses in a stripe pattern.

Preferably, the above-described electro-optical device includes an overcoat layer provided on the color filter, the overcoat layer being a light-transmissive layer, and the protrusions and recesses in stripes are provided in the overcoat layer.

Preferably, in the above-described electro-optical device, the color filter includes coloring layers of at least three colors, and the overcoat layer covers a coloring layer arranged in a first direction among the coloring layers of at least three colors.

Additionally, in the above-described electro-optical device, the coloring layer arranged in the first direction may include coloring layers having different thicknesses.

Additionally, in the above-described electro-optical device, a coloring layer arranged in a second direction intersecting with the first direction may have a thickness different from that of the coloring layer arranged in the first direction.

Preferably, in the above-described electro-optical device, the overcoat layer includes a first overcoat layer covering the color filter, and a second overcoat layer extending in a first direction on the first overcoat layer, and the protrusions and recesses in a stripe pattern are formed by the first overcoat layer and the second overcoat layer.

Additionally, in the above-described electro-optical device, the color filter may include coloring layers of at least three colors, and the protrusions and recesses in a stripe pattern may be formed by making thicknesses of two coloring layers of different colors, among the coloring layers of at least three colors, different from each other.

Preferably, in the above-described electro-optical device, the color filter includes coloring layers of at least three colors, and a light-shielding portion formed by laminating the coloring layers of at least three colors is provided in a position surrounding a light-emitting region in which the plurality of light-emitting elements are disposed.

A method of manufacturing an electro-optical device according to an aspect of the invention is a method of manufacturing an electro-optical device including a plurality of light-emitting elements and a color filter, the method including, forming a sealing layer sealing the plurality of light-emitting elements across a light-emitting region of a first substrate, the light-emitting region being a region in which the plurality of light-emitting elements are disposed, forming a color filter by forming coloring layers of at least three colors on the sealing layer, the coloring layers corresponding to the plurality of light-emitting elements, forming an overcoat layer covering a coloring layer arranged in a first direction among the coloring layers of at least three colors, the overcoat layer being a light-transmissive layer, and affixing the first substrate provided with the first substrate to a second substrate using an adhesive, the second substrate being a light-transmissive substrate.

A method of manufacturing an electro-optical device according to another aspect of the invention is a method of manufacturing an electro-optical device including a plurality of light-emitting elements and a color filter, the method including, forming a sealing layer sealing the plurality of light-emitting elements across a light-emitting region of a first substrate, the light-emitting region being a region in which the plurality of light-emitting elements are disposed, forming a color filter by forming coloring layers of at least three colors on the sealing layer, the coloring layers corresponding to the plurality of light-emitting elements, forming a first overcoat layer covering the color filter, with the first overcoat layer being a light-transmissive layer, and forming a second overcoat layer extending in the first direction on the first overcoat layer, with the second overcoat layer being a light-transmissive layer, and affixing the first substrate provided with the first overcoat layer and the second overcoat layer, to a second substrate using an adhesive, the second substrate being a light-transmissive substrate.

A method of manufacturing an electro-optical device according to another aspect of the invention is a method of manufacturing an electro-optical device including a plurality of light-emitting elements and a color filter, the method including, forming a sealing layer sealing the plurality of light-emitting elements across a light-emitting region of a first substrate, the light-emitting region being a region in which the plurality of light-emitting elements are disposed, forming a color filter by forming coloring layers of at least three colors on the sealing layer, the coloring layers corresponding to the plurality of light-emitting elements, and affixing the first substrate provided with the color filter to a second substrate using an adhesive, the second substrate being a light-transmissive substrate, wherein in the forming of the color filter, a first coloring layer and a second coloring layer, among the coloring layers of at least three colors, are formed to be arranged in a first direction, and a third coloring layer having a different thickness from the first coloring layer and the second coloring layer is formed and arranged adjacent to the first coloring layer and the second coloring layer in a second direction intersecting with the first direction.

Preferably, in the above-described method of manufacturing an electro-optical device, in the forming of the color filter, a light-shielding portion is formed by laminating the coloring layers of at least three colors in a position surrounding the light-emitting region.

Preferably, in the above-described method of manufacturing an electro-optical device, in the forming of the color filter, a light-shielding portion is formed by laminating the coloring layers of at least three colors in a position surrounding the light-emitting region, and in the forming of the overcoat layer, the overcoat layer is formed on an inner side of the light-shielding portion.

An electronic apparatus according to an aspect of the invention includes the above-described electro-optical device.

BRIEF DESCRIPTION OF THE DRAWINGS

The invention will be described with reference to the accompanying drawings, wherein like numbers reference like elements.

DESCRIPTION OF EXEMPLARY EMBODIMENTS

Figure 1:
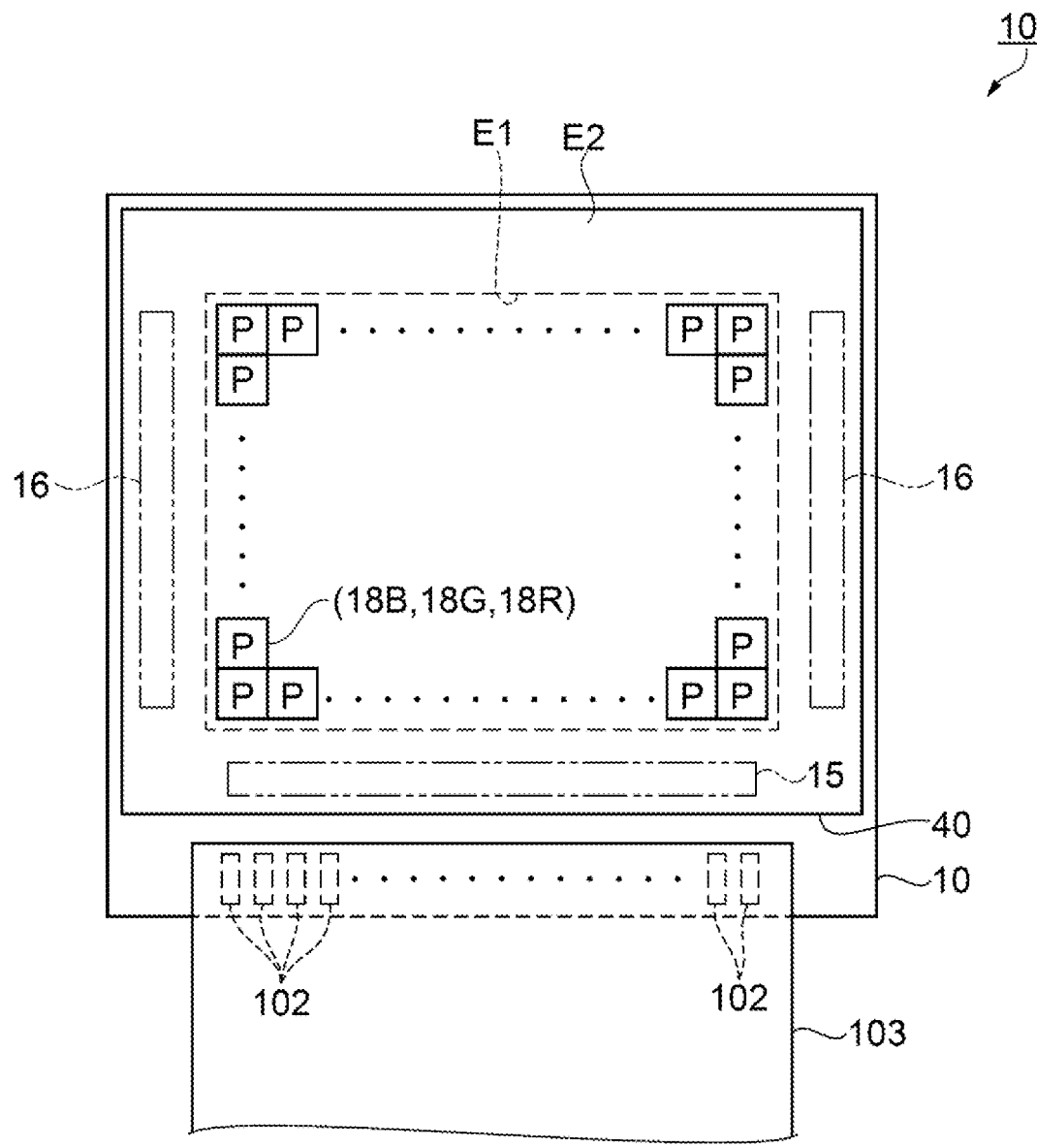
FIG. 1 is a plan view schematically illustrating the configuration of an electro-optical device according to a first exemplary embodiment.

Exemplary embodiments of the invention will be described below with reference to the accompanying drawings. Note that in the drawings referred to below, the parts described are illustrated in an enlarged or reduced state as appropriate so that those parts can be easily recognized.

First Exemplary Embodiment

Electro-Optical Device

Figure 2:
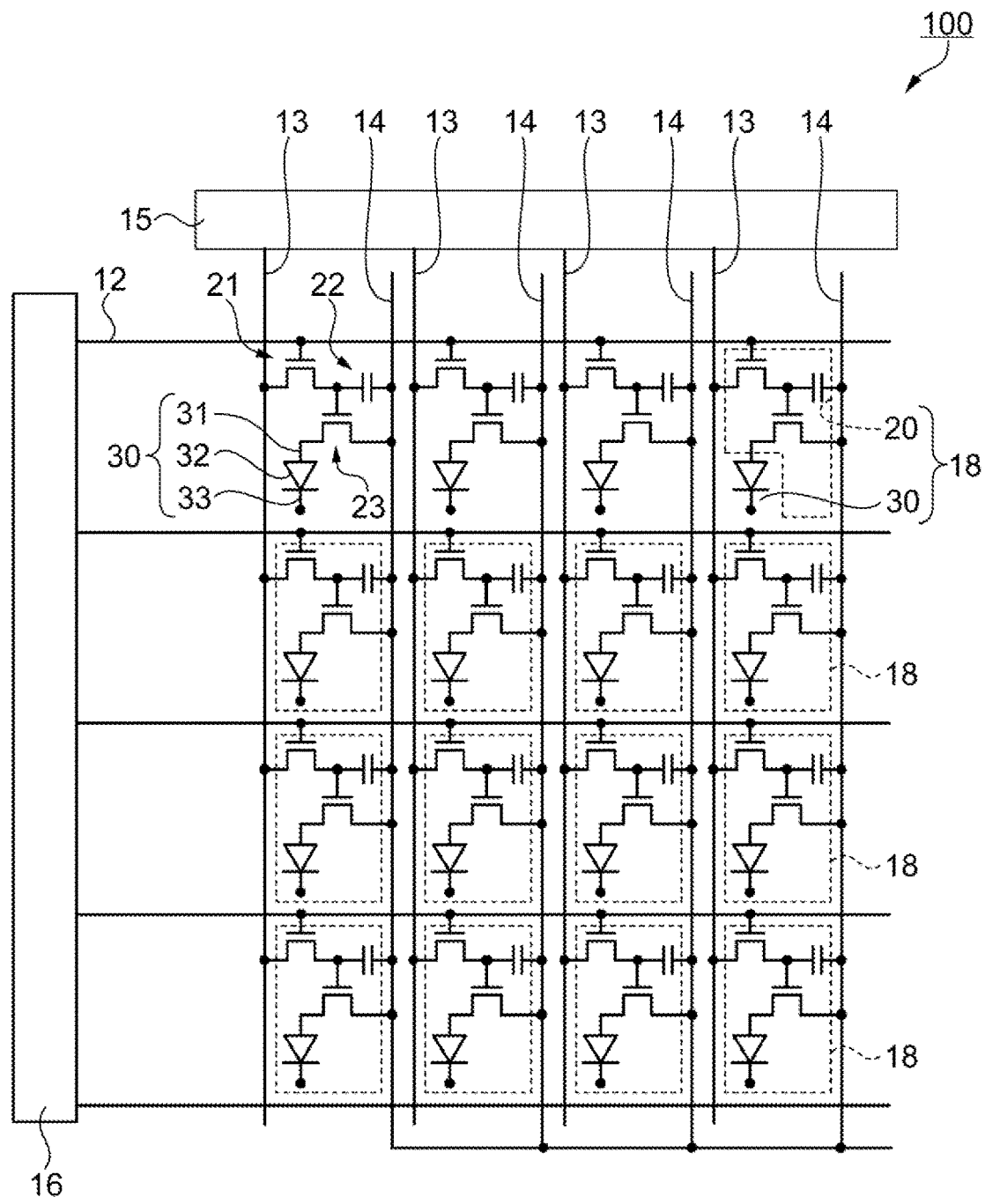
FIG. 2 is an equivalent circuit diagram illustrating the electrical configuration of the electro-optical device according to the first exemplary embodiment.
Figure 3:
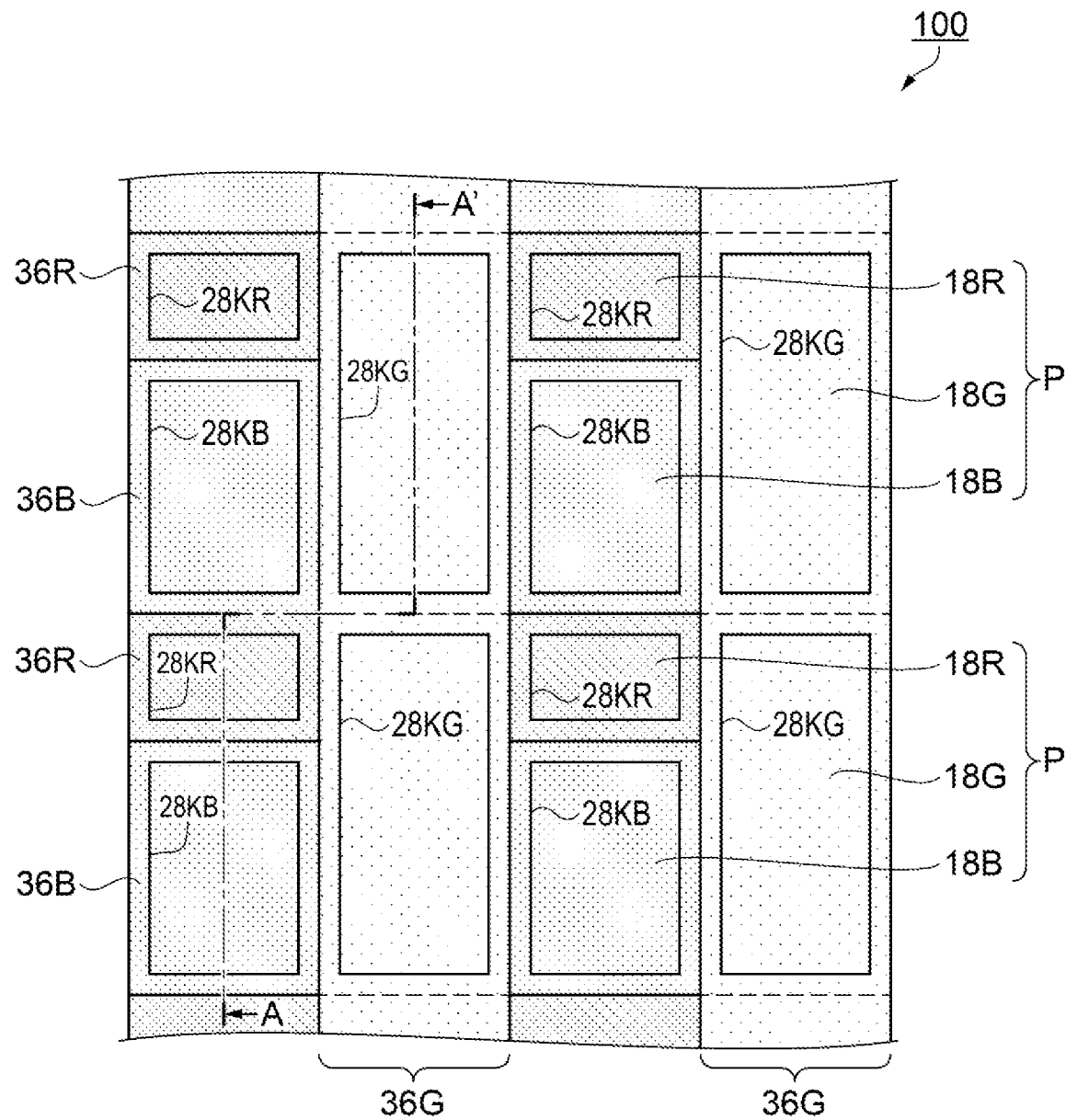
FIG. 3 is a plan view schematically illustrating the arrangement of sub pixels and a color filter in a pixel.
Figure 4:
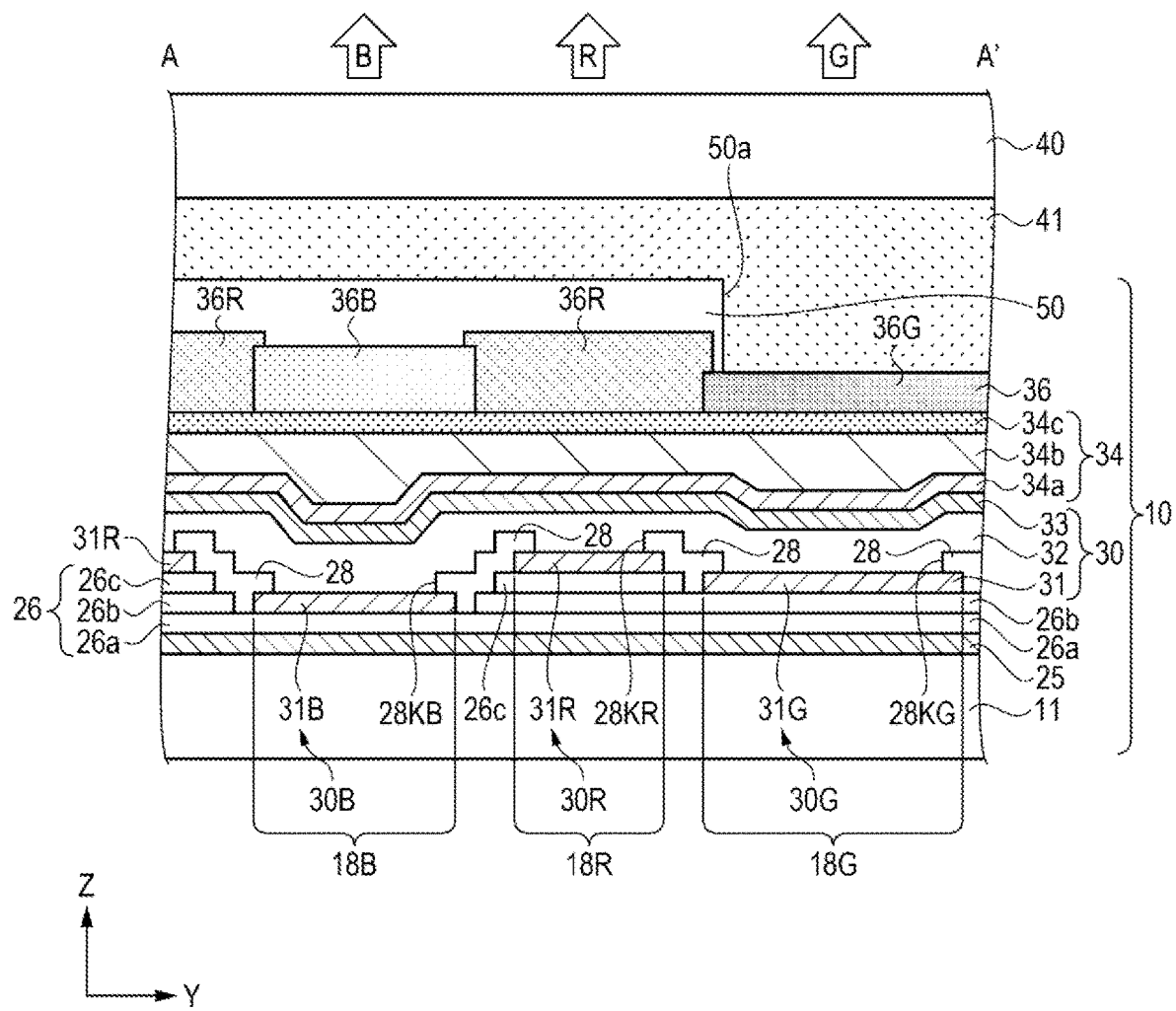
FIG. 4 is a schematic cross-sectional view illustrating the structure of a sub pixel, taken along line A-A' from FIG. 3.

An electro-optical device according to this embodiment will be described with reference to FIGS. 1 to 4. FIG. 1 is a plan view schematically illustrating the electro-optical device according to the first exemplary embodiment; FIG. 2 is an equivalent circuit diagram illustrating the electrical configuration of the electro-optical device according to the first exemplary embodiment; FIG. 3 is a plan view sche- matically illustrating the arrangement of sub pixels and a color filter in a pixel; and FIG. 4 is a schematic cross-sectional view illustrating the structure of a sub pixel, taken along line A-A' from FIG. 3. The electro-optical device according to this embodiment is a self-luminous microdisplay suitable for use as a display unit in a head-mounted display (HMD), which will be described later.

As illustrated in FIG. 1, an electro-optical device 100 according to this embodiment includes an element substrate 10 and an opposing substrate 40. These substrates are disposed facing each other, and are fixed to each other, interposing an adhesive 41 (see FIG. 4).

The element substrate 10 includes a display region E1, in which a plurality of pixels P are arranged in a matrix, and a non-display region E2, which is a peripheral region further on the outside than the display region E1. Each pixel P includes a sub pixel 18B, which emits blue (B) light; a sub pixel 18G, which emits green (G) light; and a sub pixel 18R, which emits red (R) light. The electro-optical device 100 provides a full-color display, with each pixel P, including the three sub pixels 18B, 18G, and 18R, serving as a unit of the display.

Note that the following descriptions may refer to the sub pixels 18B, 18G, and 18R collectively as "sub pixels 18". Each sub pixel 18 of this embodiment includes an organic EL element 30 serving as a light-emitting element (see FIG. 2 or FIG. 4). Accordingly, the display region E1 is an example of a light-emitting region according to the invention. Note that the display region E1 may include a region in which dummy pixels, which do not contribute to the display, are disposed, on the outside of the region in which the plurality of pixels P, which do contribute to the display, are disposed.

The element substrate 10 is an example of a first substrate according to the invention, is larger than the opposing substrate 40, and has a plurality of external connection terminals 102 arranged along a first side of the element substrate 10 that protrudes further than the opposing substrate 40. A data line driving circuit 15 is provided between the plurality of external connection terminals 102 and the display region E1. A scanning line driving circuit 16 is provided between a second side and the display region E1, and also between a third side and the display region E1, the second side and the third side oppose each other in a direction orthogonal to the first side. A flexible printed circuit (FPC) 103, for connecting with an external driving circuit that supplies control signals pertaining to the display, power, and the like, is mounted to the external connection terminals 102.

The opposing substrate 40 is an example of a second substrate according to the invention, is slightly smaller than the element substrate 10 serving as the first substrate, and is arranged so that the external connection terminals 102 are exposed. The opposing substrate 40 is a light-transmissive substrate, and a quartz substrate, a glass substrate, or the like can be used, for example. The opposing substrate 40 has a protective function for ensuring that the organic EL elements 30 (described later), which are disposed in the sub pixels 18, are not damaged, and is arranged to oppose at least the display region E1. A top-emission system, in which light emitted from the sub pixels 18 exits from the opposing substrate 40 side, is employed for the electro-optical device 100 of this embodiment.

In the following descriptions, the direction following the first side along which the external connection terminals 102 are arranged is an X direction, and the direction following the other two sides orthogonal to the first side and opposing each other (the second side and the third side) is a Y direction. The direction oriented from the element substrate 10 toward the opposing substrate 40 is a Z direction. Additionally, a view taken along the Z direction from the opposing substrate 40 side will be called a "plan view".

Electrical Configuration of Organic EL Device

As illustrated in FIG. 2, the electro-optical device 100 includes scanning lines 12 and data lines 13, which intersect with each other, and power lines 14. The scanning lines 12 are electrically connected to the scanning line driving circuit 16, and the data lines 13 are electrically connected to the data line driving circuit 15. The sub pixels 18 are provided in regions partitioned by the scanning lines 12 and the data lines 13.

Each sub pixel 18 includes an organic EL element 30 and a pixel circuit 20 that controls the driving of that organic EL element 30.

Each organic EL element 30 is constituted by a pixel electrode 31, a light-emission functional layer 32, and an opposing electrode 33. The pixel electrode 31 functions as a positive electrode that injects holes into the light-emission functional layer 32. The opposing electrode 33 functions as a negative electrode that injects electrons into the light-emission functional layer 32. In the light-emission functional layer 32, excitons (a state where a hole and an electron bind to each other under Coulomb force) are formed by the injected holes and electrons, and when the excitons decay (that is, when the holes and electrons recombine), some of the resulting energy is radiated as fluorescence or phosphorescence. In this embodiment, the light-emission functional layer 32 is configured so that white light is emitted from the light-emission functional layer 32.

Each pixel circuit 20 includes a switching transistor 21, a storage capacitor 22, and a driving transistor 23. The two transistors 21 and 23 can be configured using n channel or p channel-type transistors, for example.

The gate of the switching transistor 21 is electrically connected to the scanning line 12. The source of the switching transistor 21 is electrically connected to the data line 13. The drain of the switching transistor 21 is electrically connected to the gate of the driving transistor 23.

The drain of the driving transistor 23 is electrically connected to the pixel electrode 31 of the organic EL element 30. The source of the driving transistor 23 is electrically connected to the power line 14. The storage capacitor 22 is electrically connected between the gate of the driving transistor 23 and the power line 14.

When the switching transistor 21 is driven by the scanning line 12 under a control signal supplied from the scanning line driving circuit 16 and turns to ON state, a potential based on an image signal supplied from the data line 13 is stored in the storage capacitor 22 via the switching transistor 21. The ON/OFF state of the driving transistor 23 is determined in accordance with the potential of the storage capacitor 22, i.e., the gate potential of the driving transistor 23. When the driving transistor 23 turns to ON state, an amount of current based on the gate potential flows to the organic EL element 30 from the power line 14 via the driving transistor 23. The organic EL element 30 emits light at a luminance based on the amount of current flowing to the light-emission functional layer 32.

Note that the configuration of the pixel circuit 20 is not limited to having the two transistors 21 and 23, and for example, a transistor for controlling the current flowing to the organic EL element 30 may be further provided.

Arrangement of Sub Pixels and Color Filters

Next, the arrangement of the sub pixels 18B, 18G, and 18R and a color filter 36 in the pixels P will be described with reference to FIG. 3. As described above, the organic EL element 30 and the pixel circuit 20 are provided in each sub pixel 18, and thus in the following, an organic EL element 30 disposed in a sub pixel 18B will be called an organic EL element 30B; an organic EL element 30 disposed in a sub pixel 18G, an organic EL element 30G; and an organic EL element 30 disposed in a sub pixel 18R, an organic EL element 30R. The pixel electrode 31 in an organic EL element 30B will be called a pixel electrode 31B; the pixel electrode 31 in an organic EL element 30G, a pixel electrode 31G; and the pixel electrode 31 in an organic EL element 30R, a pixel electrode 31R.

As illustrated in FIG. 3, in this embodiment, the pixels P are arranged in a matrix along the X direction and the Y direction. The outer shape of each pixel P including the sub pixels 18B, 18G, and 18R is substantially a square, and the pitch at which the pixels P are arranged in the X direction and the Y direction is 7.5 µm, for example. In each pixel P, the sub pixel 18B and the sub pixel 18R are arranged adjacent to each other with respect to the Y direction, and the sub pixel 18G is arranged adjacent to the sub pixel 18B and the sub pixel 18R with respect to the X direction. The sub pixel 18B and the sub pixel 18R are disposed repeatedly along the Y direction in units of the pixels P. The sub pixel 18G is also disposed repeatedly along the Y direction in units of the pixels P. The range over which emitted light can be obtained from each of the sub pixels 18B, 18G, and 18R depends on openings provided in an insulating film 28 (see FIG. 4), which defines a range over which the pixel electrodes 31 of the organic EL elements 30 make contact with the light-emission functional layer 32 in each of the sub pixels 18B, 18G, and 18R. In FIG. 3, the openings are represented by solid lines, with an opening 28KB provided for each sub pixel 18B, an opening 28KG provided for each sub pixel 18G, and an opening 28KR provided for each sub pixel 18R.

Each of the openings 28KB, 28KG, and 28KR are quadrangular in shape, and the area ratio of each openings 28KB, 28KG, and 28KR is such that, for example, when the size of the opening 28KR is "1", the size of the opening 28KB is "2" and the size of the opening 28KG is "3". However, the area ratio of the openings 28KB, 28KG, and 28KR is not limited thereto.

The color filter 36 is disposed on the sub pixels 18B, 18G, and 18R. The color filter 36 is constituted by blue (B) coloring layers 36B, green (G) coloring layers 36G, and red (R) coloring layers 36R. Specifically, because the sub pixels 18B and the sub pixels 18R are arranged adjacent to each other in the Y direction, the coloring layers 36B are disposed independently for each of the plurality of sub pixels 18B, and likewise, the coloring layers 36R are disposed independently for each of the plurality of sub pixels 18R. The coloring layers 36G are disposed for the sub pixels 18G. Because the sub pixels 18G are adjacent to each other in the Y direction, the coloring layers 36G are disposed as stripes for corresponding pluralities of sub pixels 18G arranged in the Y direction.

In other words, the coloring layers 36B are disposed independently to overlap with the openings 28KB. Likewise, the coloring layers 36R are disposed independently to overlap with the openings 28KR. The coloring layers 36G are disposed as stripes extending in the Y direction to overlap with corresponding pluralities of the openings 28KG arranged in the Y direction.

Although the arrangement of the coloring layers 36B, 36G, and 36R in the element substrate 10 will be described in more detail later, in this embodiment, the coloring layers 36B and the coloring layers 36R are disposed to overlap at the boundaries between the sub pixels 18B and the sub pixels 18R adjacent to each other in the Y direction. The coloring layers 36B and the coloring layers 36G are disposed to overlap at the boundaries between the sub pixels 18B and the sub pixels 18G adjacent to each other in the X direction. Likewise, the coloring layers 36R and the coloring layers 36G are disposed to overlap at the boundaries between the sub pixels 18R and the sub pixels 18G adjacent to each other in the X direction.

In this embodiment, the Y direction in which the coloring layers 36B and the coloring layers 36R are adjacent is an example of a first direction according to the invention, and the X direction orthogonal to the Y direction is an example of a second direction intersecting with the first direction according to the invention. The coloring layer 36B is an example of a first coloring layer according to the invention, the coloring layer 36R is an example of a second coloring layer according to the invention, and the coloring layer 36G is an example of a third coloring layer according to the invention.

The luminance (brightness) of the colors of light obtained from the sub pixels 18B, 18G, and 18R depend on the sizes of the openings 28KB, 28KG, and 28KR and the optical characteristics (transmittances) of the coloring layers 36B, 36G, and 36R overlapping with the openings 28KB, 28KG, and 28KR.

Structure of Sub Pixels

Next, the structure of the sub pixels 18 in the electro-optical device 100 will be described with reference to FIG. 4. FIG. 4 illustrates a cross section taken along line A-A' from FIG. 3, where line A-A' is a line that crosses the sub pixels 18 in the Y direction, in order from the sub pixel 18B, to the sub pixel 18R, and to the sub pixel 18G.

As illustrated in FIG. 4, the electro-optical device 100 includes the element substrate 10 and the opposing substrate 40, which are disposed opposite each other interposing the adhesive 41. The adhesive 41 serves to affix the element substrate 10 and the opposing substrate 40 to each other, and is constituted by epoxy resin or acrylic resin, which have light-transmissive properties, for example. A thermosetting resin, an ultraviolet light-curing resin, or a resin cured by both heat and ultraviolet light can be used as these resins.

The element substrate 10 includes a base material 11, and a reflection layer 25, a light-transmissive layer 26, the organic EL elements 30, a sealing layer 34, and the color filter 36, which are laminated in that order in the Z direction on the base material 11.

The base material 11 is a semiconductor substrate such as silicon, for example. The scanning lines 12, the data lines 13, the power lines 14, the data line driving circuit 15, the scanning line driving circuit 16, the pixel circuits 20 (the switching transistors 21, the storage capacitors 22, and the driving transistors 23), and the like of the above-described equivalent circuit are formed in the base material 11 using a known technique. These lines, circuit configurations, and the like are not illustrated in FIG. 4.

Note that the base material 11 is not limited to a semiconductor substrate such as silicon, and may instead be a substrate constituted by quartz, glass, or the like, for example. In other words, the transistors constituting the pixel circuits 20 may be MOS type transistors having an active layer in the semiconductor substrate, or may be thin-film transistors or field-effect transistors formed in a substrate constituted by quartz, glass, or the like.

The reflection layer 25 is disposed spanning the sub pixels 18B, 18R, and 18G, and reflects light emitted from the organic EL elements 30B, 30R, and 30G of the respective sub pixels 18B, 18R, and 18G back toward the opposing substrate 40 side. A material that can realize a high reflectivity, such as aluminum, silver, or an alloy of such metals, is used as the material for forming the reflection layer 25.

The light-transmissive layer 26 is provided on the reflection layer 25. The light-transmissive layer 26 is constituted by a first insulating film 26a, a second insulating film 26b, and a third insulating film 26c. The first insulating film 26a is disposed on the reflection layer 25, spanning the sub pixels 18B, 18R, and 18G. The second insulating film 26b is laminated on the first insulating film 26a, and is disposed spanning the sub pixels 18R and the sub pixels 18G. The third insulating film 26c is laminated on the second insulating film 26b, and is disposed on the sub pixels 18R. The insulating films are constituted by silicon oxide, for example.

In other words, the light-transmissive layer 26 of the sub pixel 18B is constituted by the first insulating film 26a, the light-transmissive layer 26 of the sub pixel 18G is constituted by the first insulating film 26a and the second insulating film 26b, and the light-transmissive layer 26 of the sub pixel 18R is constituted by the first insulating film 26a, the second insulating film 26b, and the third insulating film 26c. As such, the thickness of the light-transmissive layer 26 increases in order from the sub pixel 18B, to the sub pixel 18G, and to the sub pixel 18R.

The organic EL elements 30 are provided on the light-transmissive layer 26. Each organic EL element 30 includes the pixel electrode 31, the light-emission functional layer 32, and the opposing electrode 33, laminated in that order in the Z direction. The pixel electrodes 31 are constituted by a transparent conductive film such as indium tin oxide (ITO) film, and are formed having island shapes for each of the corresponding sub pixels 18.

The insulating film 28 is disposed to cover edge portions of the pixel electrodes 31B, 31R, and 31G. As described above, the opening 28KB is formed in the insulating film 28 over the pixel electrode 31B; the opening 28KR, over the pixel electrode 31R; and the opening 28KG, over the pixel electrode 31G. The insulating film 28 is constituted by silicon oxide, for example.

In the areas where the openings 28KB, 28KR, and 28KG are provided, the pixel electrodes 31 (31B, 31R, and 31G) contact the light-emission functional layer 32, and the light-emission functional layer 32 emits light when holes are supplied from the pixel electrodes 31 to the light-emission functional layer 32 and electrons are supplied from the opposing electrode 33. In other words, the regions where the openings 28KB, 28KR, and 28KG are provided serve as regions in each of the sub pixels 18B, 18R, and 18G where the light-emission functional layer 32 emits light. In the regions where the insulating film 28 is provided, the supply of holes from the pixel electrodes 31 to the light-emission functional layer 32 is suppressed, and thus light emission from the light-emission functional layer 32 is suppressed.

The light-emission functional layer 32 is disposed to span the sub pixels 18B, 18R, and 18G and cover the entirety of the display region E1 (see FIG. 1). The light-emission functional layer 32 includes, for example, a hole injection layer, a hole transport layer, an organic light-emission layer, an electron transport layer, and the like, which are laminated in that order in the Z direction. The organic light-emission layer emits light in a wavelength range from blue to red. The organic light-emission layer may be constituted by a single layer, or may be constituted by a plurality of layers including a blue light-emitting layer, a green light-emitting layer, and a red light-emitting layer, for example, or including a blue light-emitting layer as well as a yellow light-emitting layer that can emit light including the wavelength ranges of red (R) and green (G).

The opposing electrode 33 is disposed to cover the light-emission functional layer 32. The opposing electrode 33 is constituted by an alloy of magnesium and silver, for example, and the thickness of the opposing electrode 33 is controlled, so that the electrode is both light-transmissive and reflective.

The sealing layer 34 that covers the opposing electrode 33 is constituted by a first sealing layer 34a, a flattening layer 34b, and a second sealing layer 34c, which are laminated in that order in the Z direction. The first sealing layer 34a and the second sealing layer 34c are inorganic sealing layers formed using an inorganic material. Silicon oxide, silicon nitride, silicon oxynitride, aluminum oxide, and the like, which are not easily permeated by moisture, oxygen, and the like, can be given as examples of the inorganic material. This sealing layer 34 is formed across at least the display region E1 in which the light-emission functional layer 32 (the organic EL elements 30) is disposed.

Vacuum deposition, ion implanting, sputtering, CVD, and the like can be given as examples of the method of forming the first sealing layer 34a and the second sealing layer 34c. From the standpoint of avoiding thermal damage to the organic EL elements 30, it is desirable that vacuum deposition or ion implanting be used. The thicknesses of the first sealing layer 34a and the second sealing layer 34c are, for example, from approximately 50 nm to approximately 1000 nm, and preferably from approximately 200 nm to approximately 400 nm, to make it difficult for cracks and the like to be generated during deposition while also ensuring that the layers are light-transmissive.

The flattening layer 34b is a transmissive organic sealing layer, and can be formed using a resin material such as a heat- or ultraviolet light-curing epoxy resin, acrylic resin, urethane resin, silicone resin, or the like, for example. The flattening layer 34b is laminated upon the first sealing layer 34a covering a plurality of the organic EL elements 30.

The flattening layer 34b covers defects (pinholes, cracks) arising when depositing the first sealing layer 34a, foreign materials, or the like to form a substantially flat surface. Unevenness arises in the surface of the first sealing layer 34a due to the influence of the different thicknesses in the light-transmissive layer 26, and it is thus preferable that the flattening layer 34b be formed at a thickness of from approximately 1 μm to approximately 5 μm, for example, to eliminate such unevenness. This makes it unlikely that the color filter 36 formed on the sealing layer 34 will be affected by such unevenness. From the standpoint of eliminating the unevenness caused by the light-transmissive layer 26, it is preferable that the flattening layer 34b be constituted by an organic sealing layer that can be made thicker with ease; however, the flattening layer 34b may be formed using a coating type inorganic material (silicon oxide or the like) instead.

The color filter 36 is formed on the sealing layer 34. The color filter 36 is constituted by the coloring layers 36B, 36G, and 36R, which are formed through photolithography by using a photosensitive resin material containing blue (B), green (G), and red (R) color materials. The coloring layers 36B are formed corresponding to the sub pixels 18B; the coloring layers 36R, to the sub pixels 18R; and the coloring layers 36G, to the sub pixels 18G.

Adjacent coloring layers of different colors are formed to partially overlap with each other at the boundaries between sub pixels 18 on the sealing layer 34.

The coloring layers 36B, 36R, and 36G are formed by first applying photosensitive resin materials containing color materials of the respective colors through a method such as spin coating to form a photosensitive resin layer, and then exposing and developing the photosensitive resin layer using photolithography. In this embodiment, the coloring layers 36G, the coloring layers 36B, and the coloring layers 36R are formed in that order.

Accordingly, the edges of the coloring layers 36G in the X direction are covered by the edges of the coloring layers 36B and the edges of the coloring layers 36R, and the edges of the coloring layers 36B in the Y direction are covered by the edges of the coloring layers 36R.

An overcoat (OC) layer 50 is provided to overlap with the coloring layers 36B and the coloring layers 36R, which of the three colors of coloring layers 36B, 36G, and 36R, are disposed adjacent to each other and repeating in the Y direction. While the OC layer 50 does cover parts corresponding to the boundaries between the coloring layers 36R (the coloring layers 36B) and the coloring layers 36G, the OC layer 50 is not provided at parts aside from the boundaries of the coloring layers 36G. Although the method of forming the OC layer 50 will be described in detail later, the OC layer 50 is formed by first applying a transmissive photosensitive resin material through a method such as spin coating to form a photosensitive resin layer, and then exposing and developing the photosensitive resin layer using photolithography. In other words, by forming the OC layer 50 to cover the coloring layers 36B and the coloring layers 36R, grooves 50a that follow the Y direction along which the coloring layers 36G extend are formed on the surface of the color filter 36 that is affixed to the adhesive 41. The grooves 50a are formed along the coloring layers 36G corresponding to one color. The grooves 50a are an example of protrusions and recesses in a stripe pattern in an adhesive surface of the color filter, according to the invention.

Optical Resonance Structure

The electro-optical device 100 according to this embodiment is provided with an optical resonance structure between the reflection layer 25 and the opposing electrode 33. In the electro-optical device 100, light emitted by the light-emission functional layer 32 is repeatedly reflected between the reflection layer 25 and the opposing electrode 33, the intensity of light of a specific wavelength (a resonant wavelength) corresponding to the optical distance between the reflection layer 25 and the opposing electrode 33 is amplified, and the light passing through the color filter 36 is emitted from the opposing substrate 40 in the Z direction as display light.

In this embodiment, the light-transmissive layer 26 has a function of adjusting the optical distance between the reflection layer 25 and the opposing electrode 33. As described above, the thickness of the light-transmissive layer 26 increases in order from the sub pixel 18B, to the sub pixel 18G, and to the sub pixel 18R. As a result, the optical distance between the reflection layer 25 and the opposing electrode 33 increases in order from the sub pixel 18B, to the sub pixel 18G, and to the sub pixel 18R. Note that the optical distance can be expressed as the total of the products of the refractive indices and thicknesses of each layer between the reflection layer 25 and the opposing electrode 33.

For example, in the sub pixels 18B, the thickness of the light-transmissive layer 26 is set so that the resonant wavelength (a peak wavelength of maximum luminance) is 470 nm. In the sub pixels 18G, the thickness of the light-transmissive layer 26 is set so that the resonant wavelength is 540 nm. In the sub pixels 18R, the thickness of the light-transmissive layer 26 is set so that the resonant wavelength is 610 nm.

As a result, blue light (B) having a peak wavelength of 470 nm is emitted from the sub pixels 18B, green light (G) having a peak wavelength of 540 nm is emitted from the sub pixels 18G, and red light (R) having a peak wavelength of 610 nm is emitted from the sub pixels 18R. In other words, the electro-optical device 100 has an optical resonance structure that amplifies the intensity of light at a specific wavelength, where a blue light component is obtained from the white light emitted from the light-emission functional layer 32 in the sub pixels 18B, a green light component is obtained from the white light emitted from the light-emission functional layer 32 in the sub pixels 18G, and a red light component is obtained from the white light emitted from the light-emission functional layer 32 in the sub pixels 18R.

Note that rather than using the light-transmissive layer 26, the configuration for adjusting the optical distance between the reflection layer 25 and the opposing electrode 33 may be realized by varying the thicknesses of the pixel electrodes 31 (31B, 31G, and 31R).

The color filter 36 is disposed on the sealing layer 34 in the sub pixels 18B, 18G, and 18R. The coloring layers 36B are disposed on the organic EL elements 30B of the sub pixels 18B, with the sealing layer 34 interposed between the organic EL elements 30B and the coloring layers 36B. Accordingly, the color purity can be increased by the blue light (B), which has a peak wavelength of 470 nm, passing through the coloring layers 36B. Likewise, the coloring layers 36G are disposed on the organic EL elements 30G of the sub pixels 18G, with the sealing layer 34 interposed between the organic EL elements 30G and the coloring layers 36G, and the coloring layers 36R are disposed on the organic EL elements 30R of the sub pixels 18R, with the sealing layer 34 interposed between the organic EL elements 30R and the coloring layers 36R. Accordingly, the color purity can be increased by the green light (G), which has a peak wavelength of 540 nm, passing through the coloring layers 36G, and the color purity can be increased by the red light (R), which has a peak wavelength of 610 nm, passing through the coloring layers 36R.

The optical characteristics, such as the color purity of the respective colors of light, depend on the thicknesses of the coloring layers 36B, 36G, and 36R. In this embodiment, the blue coloring layers 36B and the red coloring layers 36R are formed to have an average thickness on the sealing layer 34 of 2 μm, and similarly, the green coloring layers 36G are formed to have an average thickness of approximately 1 μm. Note that the settings for the thicknesses of the coloring layers 36B, 36G, and 36R are not limited thereto.

As described above, the light emitted from the sub pixels 18 is light emitted from the opposing electrode 33 toward the sealing layer 34 and passing through the coloring layers 36B, 36G, and 36R and is light having different spectra than the spectrum of the light emitted within the light-emission functional layer 32 of the organic EL elements 30.

Structure for Affixing Element Substrate and Opposing Substrate

Figure 5:
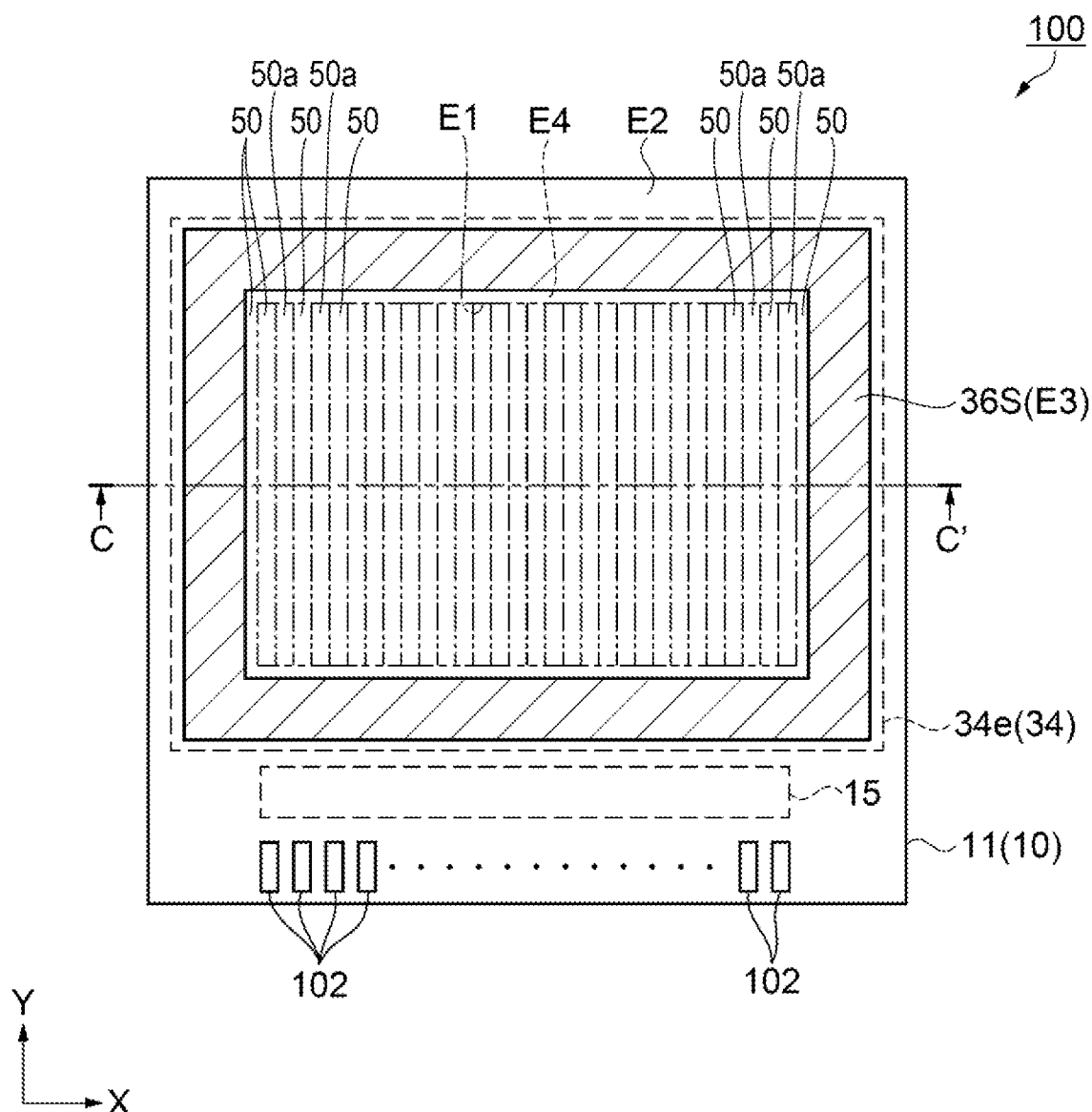
FIG. 5 is a plan view schematically illustrating the arrangement of a light-shielding portion in an element substrate.
Figure 6:
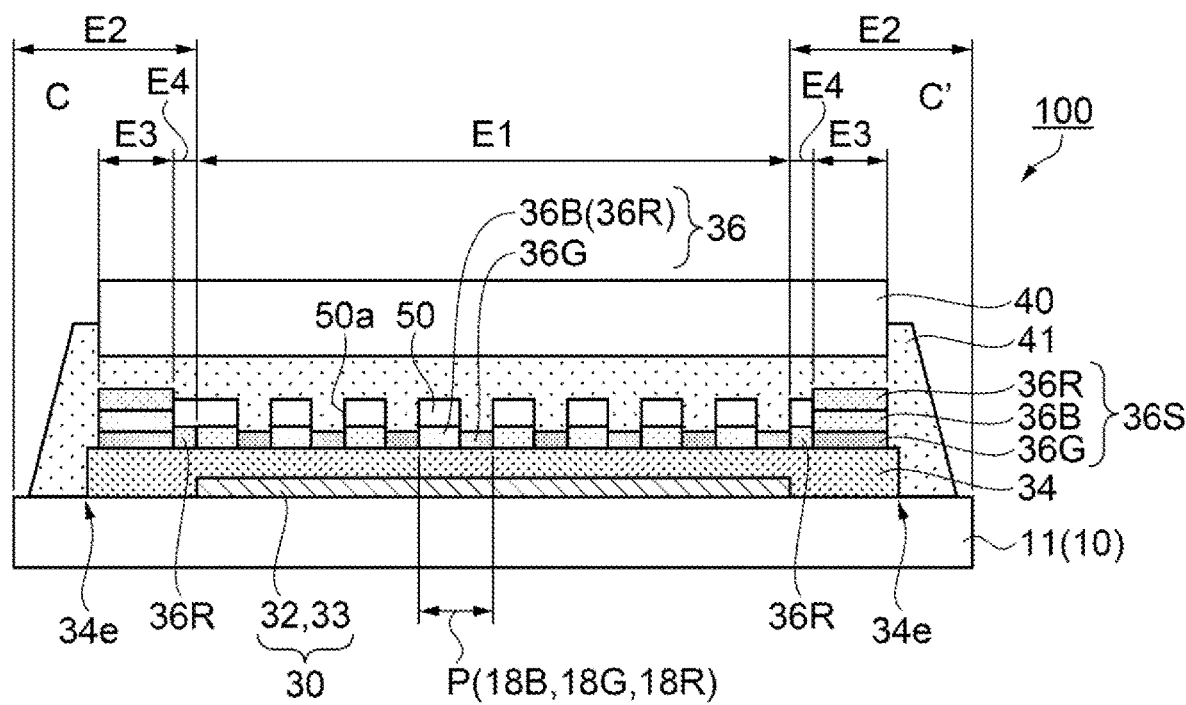
FIG. 6 is a schematic cross-sectional view illustrating the structure of the electro-optical device, taken along line C-C' from FIG. 5.

Next, a structure for affixing the element substrate 10 and the opposing substrate 40 will be described with reference to FIGS. 5 and 6. FIG. 5 is a plan view schematically illustrating the arrangement of a light-shielding portion in the element substrate, and FIG. 6 is a schematic cross-sectional view illustrating the structure of the electro-optical device, taken along line C-C' from FIG. 5. Line C-C' in FIG. 5 is a line that crosses the light-shielding portion and the display region E1 in the X direction. Note that in FIG. 6, the pixel circuits 20 in the element substrate 10, as well as the scanning lines 12, the data lines 13, the power lines 14, the data line driving circuit 15, and the scanning line driving circuit 16 connected to the pixel circuits 20, are not illustrated.

As illustrated in FIG. 5, the element substrate 10 of the electro-optical device 100 is provided with a frame-shaped light-shielding portion 36S surrounding the display region E1. The light-portion 36S is provided to overlap with the scanning line driving circuit 16 (see FIG. 1), which is provided in the non-display region E2 located on the outside of the display region E1, when viewed in plan view. A dummy color filter region E4 (called a "dummy CF region E4" hereinafter) is provided between the inner edges of the frame-shaped light-shielding portion 36S and the display region E1. Providing the frame-shaped light-shielding portion 36S surrounding the display region E1 in this manner results in a configuration making it possible to prevent the light emitted from the display region E1 from being reflected by other parts and affecting the display light, or entering the peripheral circuits such as the scanning line driving circuit 16 and destabilizing the operations of the transistors and the like included in the peripheral circuits. The region in which the light-shielding portion 36S is provided in a frame shape will be called a "light-shielding region E3" hereinafter.

As illustrated in FIG. 6, the element substrate 10 and the opposing substrate 40 are disposed opposing each other, and are affixed to each other, interposing the adhesive 41. The light-emission functional layer 32 and the opposing electrode 33, which partially constitute the organic EL element 30, are provided on the base material 11 of the element substrate 10 across the display region E1. The sealing layer 34 is provided covering the light-emission functional layer 32 and the opposing electrode 33. Outer edge 34e of the sealing layer 34 is located slightly further to the outside than the light-shielding region E3 (see FIG. 5).

The coloring layers 36B, 36G, and 36R are provided on the sealing layer 34, in the display region E1, to correspond to the sub pixels 18B, 18G, and 18R of the pixels P. The above-described light-shielding portion 36S is provided in a position surrounding the display region E1. The light-shielding portion 36S is configured to shield entering light as a result of laminating the coloring layers 36G, the coloring layers 36B, and the coloring layers 36R in that order. The width of the frame-shaped light-shielding portion 36S (the light-shielding region E3) on the sealing layer 34 is, for example, from approximately 0.5 mm to approximately 1.0 mm.

The coloring layer 36R is provided as a dummy CF on the sealing layer 34, in the dummy CF region E4 between the light-shielding portion 36S and the color filter 36 corresponding to the pixels P in the display region E1. The dummy CF is not limited to the red (R) coloring layer 36R, and another color of coloring layer may be used; however, it is preferable that the coloring layer 36R, which is thicker than the coloring layer 36G, be used in consideration of light leakage. The width of the dummy CF region E4 between the display region E1 and the light-shielding region E3 is, for example, from 50 μm to 300 μm.

As described above, in the display region E1, the stripe-shaped OC layer 50 is provided to overlap with the coloring layers 36B and the coloring layers 36R which, of the color filter 36, are arranged in the Y direction. The pixels P thus include the parts where the OC layer 50 is provided, and the parts where the OC layer 50 is not provided and the grooves 50a are formed between the adjacent pixels P. In other words, the grooves 50a, serving as protrusions and recesses in a stripe pattern extending in the Y direction for each pixel P arranged in the X direction, are provided in the adhesive surface of the color filter 36 that makes contact with the adhesive 41. Note that the number of stripes in the OC layer 50 and grooves 50a in the display region E1, illustrated in FIG. 5, is determined by the number of pixels P arranged in the X direction. FIGS. 5 and 6 illustrate the stripe-shaped OC layer 50 and grooves 50a at a number that is visually recognizable.

Method of Manufacturing Electro-Optical Device

Figure 7:
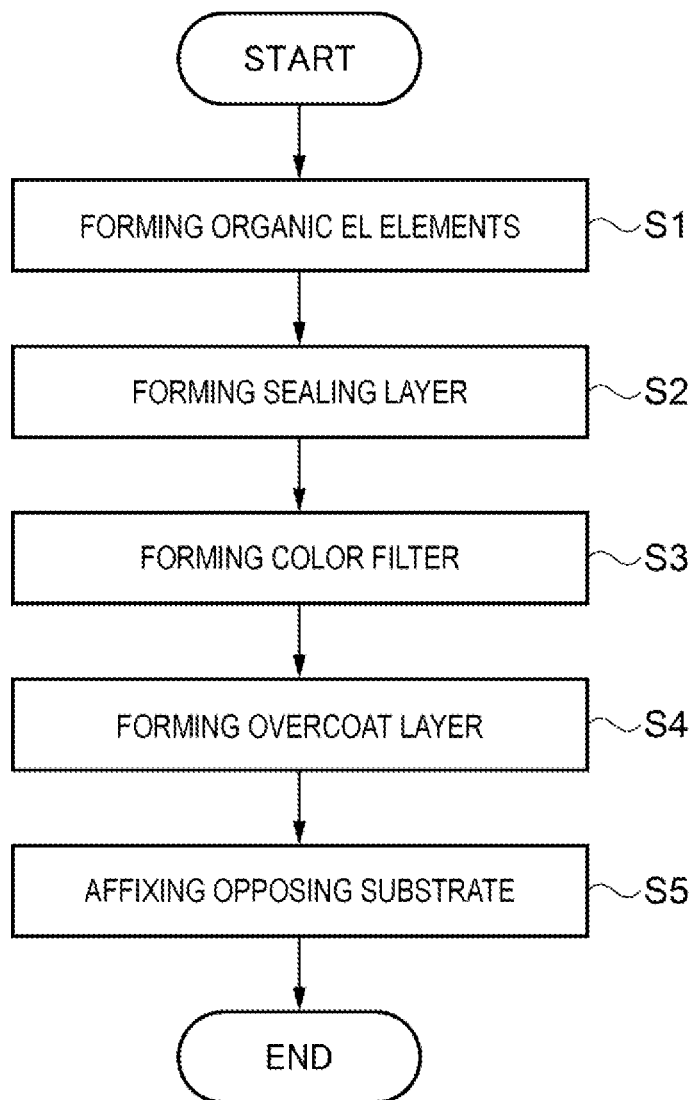
FIG. 7 is a flowchart illustrating a method of manufacturing the electro-optical device according to the first exemplary embodiment.

Next, a method of manufacturing the electro-optical device 100 will be described with reference to FIGS. 7 to 11. FIG. 7 is a flowchart illustrating the method of manufacturing the electro-optical device according to the first exemplary embodiment, and FIGS. 8 to 11 are schematic cross-sectional views illustrating the method of manufacturing the electro-optical device according to the first exemplary embodiment.

As illustrated in FIG. 7, the method of manufacturing the electro-optical device 100 includes a process of forming the plurality of organic EL elements 30 on the base material 11 (step S1), a sealing layer formation process of forming the sealing layer 34 for sealing the plurality of organic EL elements 30 (step S2), a color filter formation process of forming the color filter 36 on the sealing layer 34 (step S3), an overcoat (OC) formation process of forming the overcoat (OC) layer 50 (step S4), and a process of affixing the opposing substrate 40 to the element substrate 10 (step S5). Note that as described above, a known method can be used for the processes for forming the peripheral circuits such as the data line driving circuit 15 and the scanning line driving circuit 16, the pixel circuits 20, the lines connecting those circuits, the external connection terminals 102, and the like in the base material 11. The same applies to the reflection layer 25 and the light-transmissive layer 26. Therefore, the process will be described from step S1.

Step S1 is a process of forming the organic EL elements 30, in which the pixel electrodes 31 are formed in the display region E1 for each of the sub pixels 18, the light-emission functional layer 32 and the opposing electrode 33 are formed spanning a plurality of the sub pixels 18, and the organic EL elements 30 are formed for each of the sub pixels 18. Then, the process proceeds to step S2.

Step S2 is a process of forming the sealing layer 34, in which the sealing layer 34, which seals the plurality of organic EL elements 30 formed in the display region E1, is formed. To be more specific, the first sealing layer 34a is formed, using an inorganic material, to cover the opposing electrode 33. The flattening layer 34b is then formed by forming the organic sealing layer using a resin material and then patterning the organic sealing layer. The second sealing layer 34c is then formed using an inorganic material to cover the flattening layer 34b as well as the first sealing layer 34a protruding from the flattening layer 34b. The sealing layer 34 is formed as a result. Note that from the standpoint of improving the sealing characteristics, it is preferable that the first sealing layer 34a and the second sealing layer 34c, which are constituted by an inorganic material, are formed to sandwich the flattening layer 34b, which is constituted by an organic material, and to extend to the outer peripheral ends of the base material 11. Then, the process proceeds to step S3.

Step S3 is a process of forming the color filter 36, in which the coloring layers 36B, 36G, and 36R are formed on the sealing layer 34 in the display region E1, corresponding to the three sub pixels 18B, 18G, and 18R. As described above, in the method of forming the coloring layers 36B, 36G, and 36R, photosensitive resin materials containing the color materials are first applied through spin coating to form a photosensitive resin layer, and the photosensitive resin layer is then exposed and developed using photolithography. In this embodiment, the coloring layers 36G, the coloring layers 36B, and the coloring layers 36R are formed in that order. Additionally, in the process of forming the color filter 36, the light-shielding portion 36S is formed in the light-shielding region E3 surrounding the display region E1 by laminating the three coloring layers 36G, 36B, and 36R in that order, at the same time as when the coloring layers 36G, 36B, and 36R are formed in the display region E1. Furthermore, in this embodiment, the coloring layer 36R, which of the three coloring layers 36B, 36G, and 36R, is the thickest and thus contributes the most to the light-shielding properties, is formed in the dummy CF region E4 between the display region E1 and the light-shielding region E3. Note that the order in which the three color of the coloring layers 36B, 36G, and 36R are formed is not limited to green (G), blue (B), and red (R). Because coloring layers having different colors overlap at the boundaries between sub pixels 18, it is preferable that the thinnest layer be formed first. Then, the process proceeds to step S4.

Figure 8:
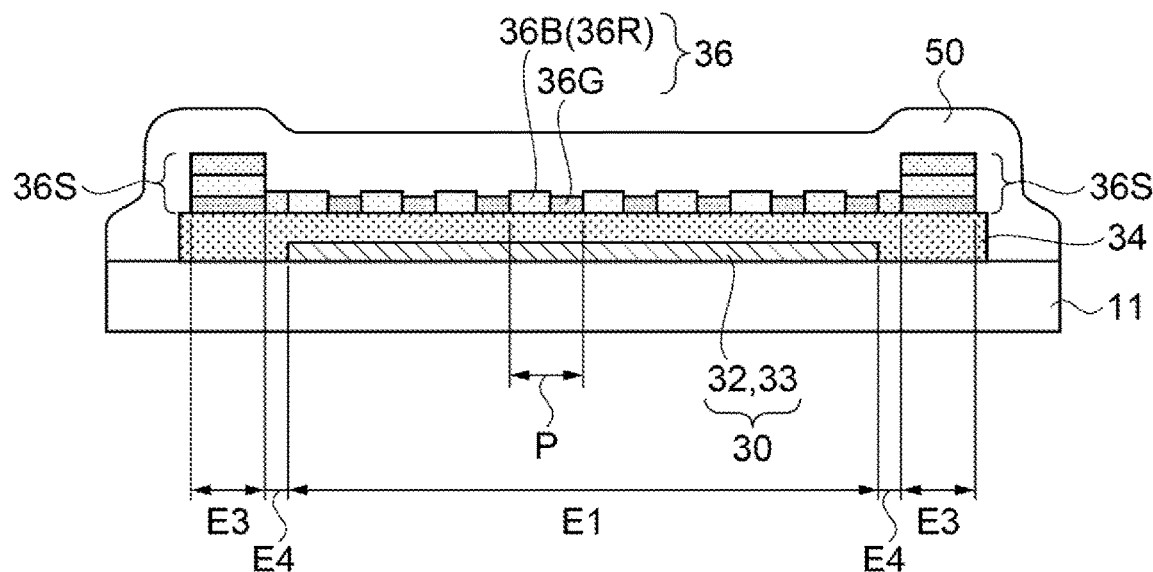
FIG. 8 is a schematic cross-sectional view illustrating the method of manufacturing the electro-optical device according to the first exemplary embodiment.

Step S4 is a process of forming the overcoat (OC) layer 50, in which the OC layer 50 is first formed covering the color filter 36 formed in the display region E1, the light-shielding portion 36S, and the coloring layer 36R serving as the dummy CF, through spin coating or the like using a photosensitive resin material that does not contain a color material, for example, as illustrated in FIG. 8. At this time, the thickness of the OC layer 50 is approximately 1 μm, for example.

Figure 9:
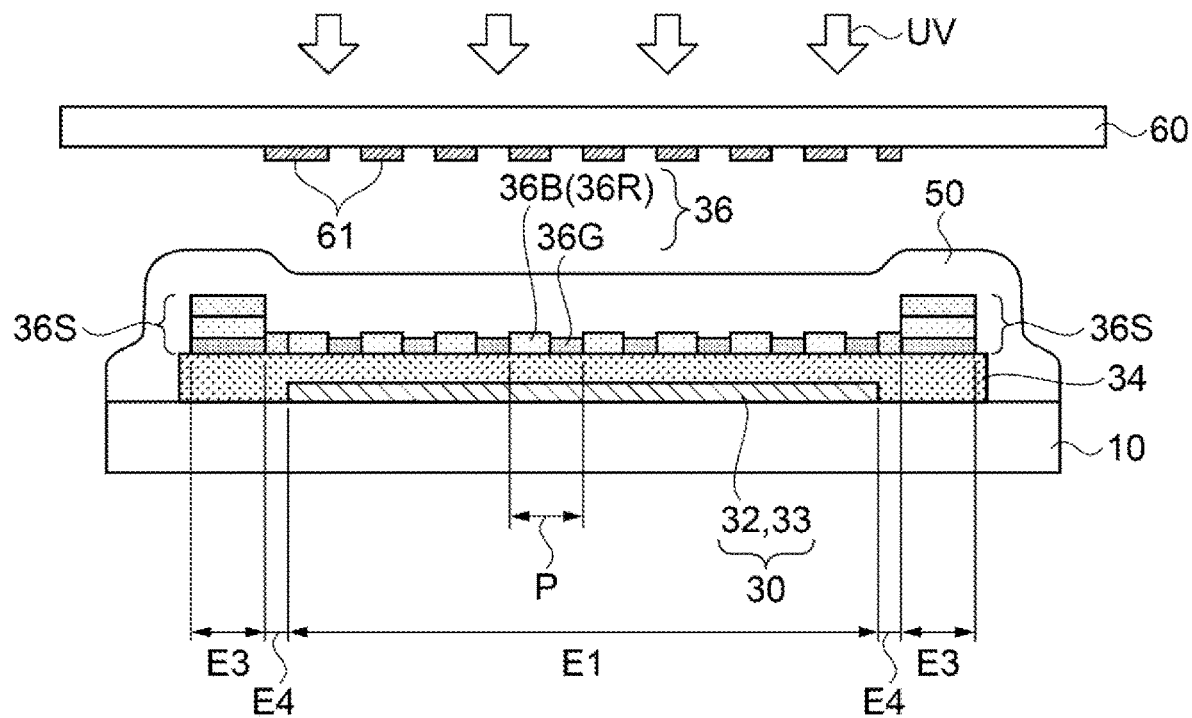
FIG. 9 is a schematic cross-sectional view illustrating the method of manufacturing the electro-optical device according to the first exemplary embodiment.

Next, as illustrated in FIG. 9, the OC layer 50 is irradiated with ultraviolet (UV) light, for example, over an exposure mask 60. A light-shielding pattern 61 is provided in the mask 60. The light-shielding pattern 61 includes a plurality of stripe-shaped light-shielding layers extending in the Y direction in positions overlapping with the coloring layers 36B and the coloring layers 36R formed in the display region E1. The light-shielding pattern 61 also includes a light-shielding layer formed in a frame shape, in positions overlapping the coloring layer 36R formed in the dummy CF region E4.

Figure 10:
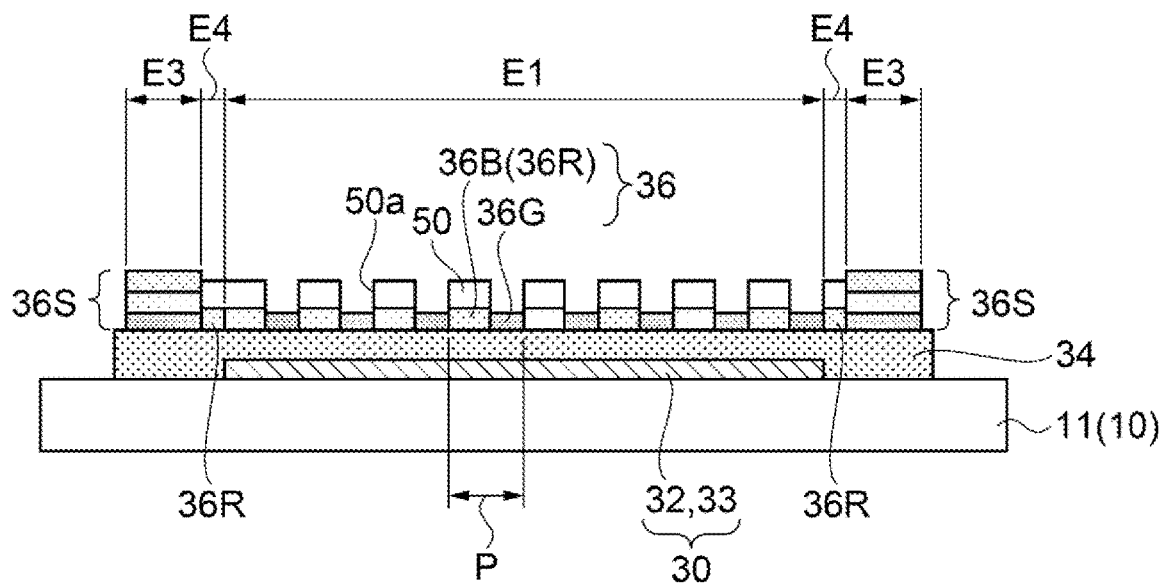
FIG. 10 is a schematic cross-sectional view illustrating the method of manufacturing the electro-optical device according to the first exemplary embodiment.

Once the OC layer 50 irradiated with ultraviolet (UV) light is developed, the OC layer 50 is formed having been patterned to overlap with the coloring layers 36B and the coloring layers 36R in the display region E1 and to overlap with the coloring layer 36R serving as the dummy CF in the dummy CF region E4, as illustrated in FIG. 10. As a result, the grooves 50a are formed in the patterned OC layer 50 to extend in the Y direction, in positions overlapping the coloring layers 36G in the display region E1. The OC layer 50 is formed on the inner side of the light-shielding portion 36S. Because the OC layer 50 is formed to cover the coloring layers 36B and the coloring layers 36R arranged in the Y direction, the thicknesses of the coloring layers 36B and the coloring layers 36R may differ. Then, the process proceeds to step S5.

Figure 11:
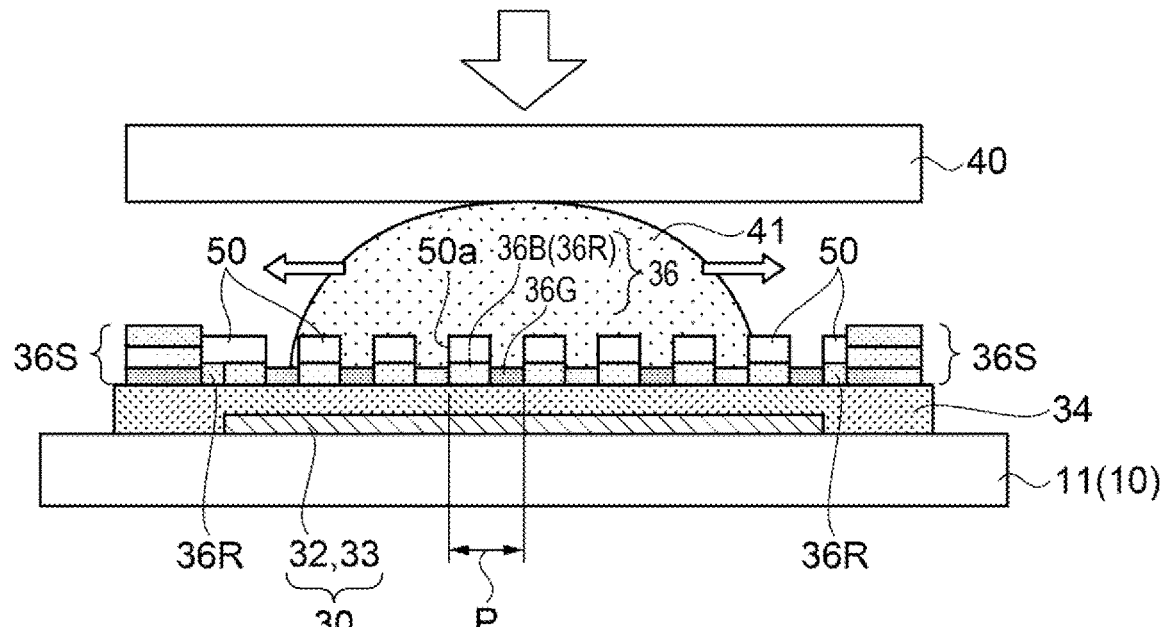
FIG. 11 is a schematic cross-sectional view illustrating the method of manufacturing the electro-optical device according to the first exemplary embodiment.

Step S5 is a process of affixing the element substrate 10, on which the OC layer 50 is formed, to the opposing substrate 40, using the adhesive 41. Specifically, as illustrated in FIG. 11, a prescribed amount of the adhesive 41 is applied on the color filter 36 of the element substrate 10, after which the opposing substrate 40 is pressed toward the element substrate 10 from above so that the applied adhesive 41 spreads out. Because the plurality of grooves 50a, which follow the Y direction, are formed in the adhesive surface of the color filter 36, the adhesive 41 spreads out along the plurality of grooves 50a.

Because the light-shielding portion 36S surrounding the display region E1 is formed from the three coloring layers 36G, 36B, and 36R laminated in that order, the height of the light-shielding portion 36S on the sealing layer 34 is approximately 5 μm. However, the height of the color filter 36 on the sealing layer 34 is a maximum of approximately 2 μm. The OC layer 50, which is approximately 1 μm thick, is formed on the coloring layer 36R serving as the dummy CF provided between the light-shielding region E3 and the display region E1. Therefore, as the substantial height of the dummy CF on the sealing layer 34 is approximately 3 μm, a level difference between the light-shielding portion 36S and the color filter 36 can be reduced as compared to a case where the dummy CF is not provided. The adhesive 41 that has spread out on the color filter 36 fills the level difference between the light-shielding portion 36S and the color filter 36, and passes over the light-shielding portion 36S, more easily than in the past. The adhesive 41 is cured in a state where the adhesive 41 has spread to a predetermined application range on the base material 11, and the element substrate 10 is affixed to the opposing substrate 40 as a result.

The electro-optical device 100 illustrated in FIG. 1 is completed by then mounting the FPC 103 to the terminal parts of the element substrate 10.

According to the electro-optical device 100 and the method of manufacturing the electro-optical device 100 of the first exemplary embodiment, the following effects can be achieved.

(1) In the color filter 36, the coloring layers 36B and the coloring layers 36R are formed so that the end parts of those layers overlap each other at the boundaries in the Y direction. Additionally, the coloring layers 36G are formed so that the end parts of the coloring layers 36G overlap with the coloring layers 36B and the coloring layers 36R at the boundaries in the X direction. The OC layer 50 is then formed on the color filter 36 of this element substrate 10 through patterning, in positions overlapping with the coloring layers 36B and the coloring layers 36R arranged in the Y direction. As a result, the plurality of grooves 50a, serving as protrusions and recesses in a stripe pattern extending in the Y direction, are formed in the surface of the color filter 36 affixed to the adhesive 41. The grooves 50a are formed in positions overlapping with the coloring layers 36G, which similarly extend in the Y direction, in the sub pixels 18G. In other words, there is no level difference in the base part of the grooves 50a. In the affixing process, where the element substrate 10 and the opposing substrate 40 are affixed to each other, the adhesive 41 spreads out along the plurality of grooves 50a when the opposing substrate 40 is pressed so that the adhesive 41 applied to the element substrate 10 spreads out. Accordingly, it is more difficult for unevenness to arise in the adhesive 41 than when complex level differences are present in the color filter 36 due to the three coloring layers 36B, 36G, and 36R having different thicknesses and the OC layer 50 not being present, for example. Additionally, the adhesive 41 spreads out along the plurality of grooves 50a, which extend in the Y direction serving as the first direction and which have no level differences in their base parts, and it is therefore difficult for bubbles to form in the grooves 50a. In other words, an electro-optical device 100 in which bubbles that affect the display do not easily form, and a method of manufacturing the electro-optical device 100, can be provided.

(2) The light-shielding portion 36S formed in a position surrounding the display region E1 is formed by laminating the three coloring layers 36G, 36B, and 36R, which have different colors, in that order, and the height of the light-shielding portion 36S on the sealing layer 34 is approximately 5 μm. The dummy CF region E4 is provided, in a frame shape, between the light-shielding region E3 where the light-shielding portion 36S is provided and the display region E1 where the color filter 36 is provided. The red coloring layer 36R, serving as the dummy CF, and the OC layer 50, formed through patterning, are provided in the dummy CF region E4. The combined height of the coloring layer 36R and the OC layer 50 on the sealing layer 34 is 3 μm. In other words, forming the dummy CF region E4 between the light-shielding region E3 and the display region E1 in this manner makes it possible to reduce the level difference between the light-shielding portion 36S and the color filter 36 while maintaining light-shielding properties. Accordingly, when affixing the element substrate 10 and the opposing substrate 40 using the adhesive 41, a situation in which the substrates are affixed with bubbles present between the light-shielding portion 36S, which is the highest part on the sealing layer 34, and the color filter 36, can be suppressed.

(3) The plurality of grooves 50a obtained by patterning the OC layer 50 are formed to overlap with the coloring layers 36G, which are the thinnest of the three coloring layers 36B, 36G, and 36R. Accordingly, the grooves 50a are deeper, and it is thus easier to restrict the direction in which the adhesive 41 spreads out when affixing the element substrate 10 and the opposing substrate 40, than when the thickness of the coloring layers 36G is the same as the other coloring layers 36B and 36R. This makes it possible to suppress unevenness in the application of the adhesive 41 and achieve a uniform application state. In other words, the coloring layers 36G arranged in the X direction, serving as the second direction intersecting with the Y direction, have a different thickness from, and are preferably thinner than, the coloring layers 36B and 36R arranged in the Y direction, serving as the first direction in which the OC layer 50 is formed.

The pixels P of the electro-optical device 100 according to the first exemplary embodiment described above are configured so that the sub pixels 18B (the coloring layers 36B) and the sub pixels 18R (the coloring layers 36R) are arranged in the Y direction serving as the first direction, and the sub pixels 18G (the coloring layers 36G) are arranged in the X direction, serving as the second direction, with respect to the sub pixels 18B (the coloring layers 36B) and the sub pixels 18R (the coloring layers 36R). However, the configuration is not limited thereto. For example, the configuration may be such that the sub pixels 18B (the coloring layers 36B) and the sub pixels 18R (the coloring layers 36R) are arranged in the X direction serving as the first direction, and the sub pixels 18G (the coloring layers 36G) are arranged in the Y direction, serving as the second direction, with respect to the sub pixels 18B (the coloring layers 36B) and the sub pixels 18R (the coloring layers 36R). In this case, the configuration is such that the plurality of grooves 50a, extending in the X direction and serving as protrusions and recesses in a stripe pattern, are provided in the adhesive surface of the color filter 36. The direction in which the plurality of grooves 50a, serving as the protrusions and recesses in a stripe pattern extend, is not limited to the Y direction, and may be the X direction instead.

Second Exemplary Embodiment

Figure 12:
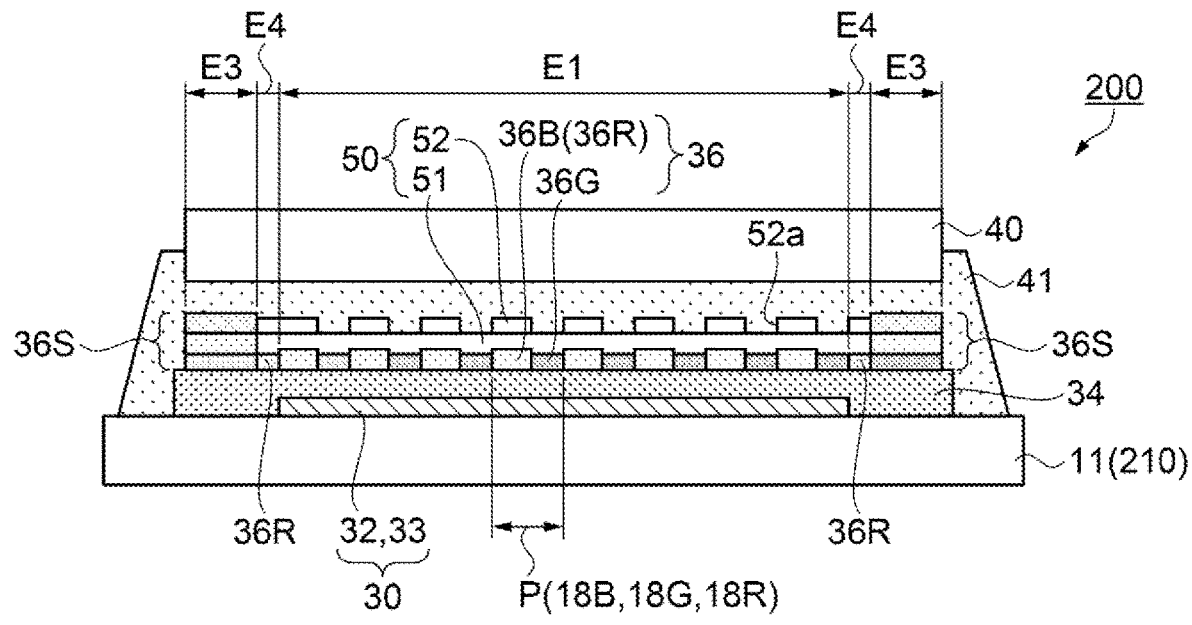
FIG. 12 is a schematic cross-sectional view illustrating the structure of an electro-optical device according to a second exemplary embodiment.
Figure 13:
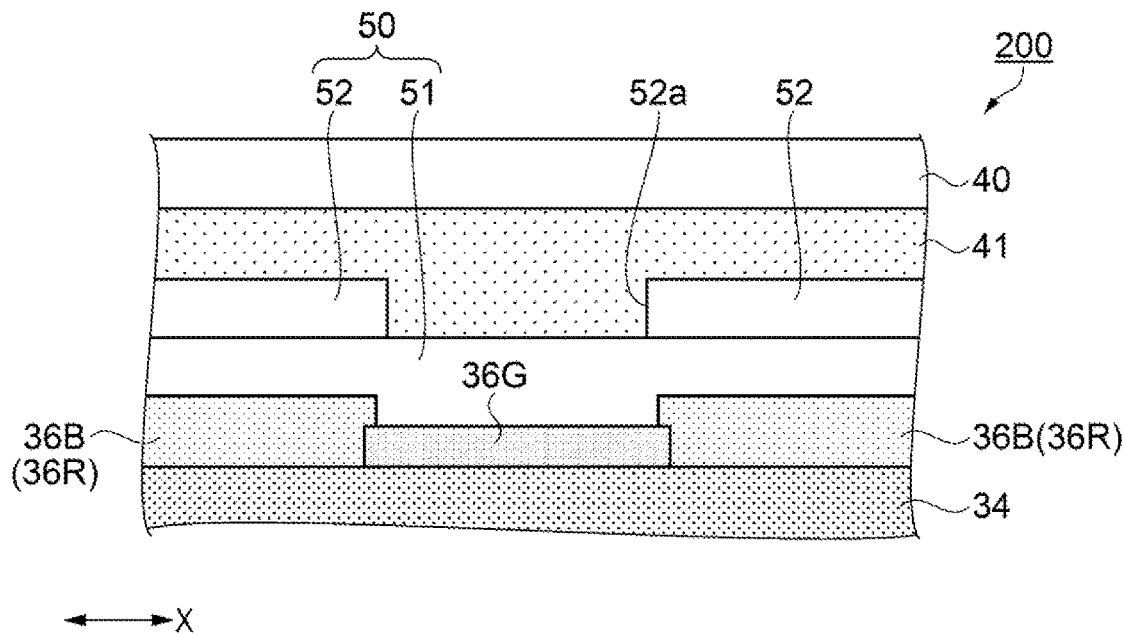
FIG. 13 is an enlarged cross-sectional view illustrating the structure of a color filter and an overcoat layer in the electro-optical device according to the second exemplary embodiment.

Next, an electro-optical device, and a method of manufacturing the electro-optical device, according to a second exemplary embodiment will be described with reference to FIGS. 12 and 13. FIG. 12 is a schematic cross-sectional view illustrating the structure of the electro-optical device according to the second exemplary embodiment, and FIG. 13 is an enlarged cross-sectional view illustrating the structure of a color filter and an overcoat layer in the electro-optical device according to the second exemplary embodiment. Note that FIG. 12 is a schematic cross-sectional view corresponding to FIG. 6, described in the foregoing first exemplary embodiment.

An electro-optical device 200 of the second exemplary embodiment differs from the electro-optical device 100 of the foregoing first exemplary embodiment in terms of the configuration of the overcoat layer 50. The rest of the configuration is the same, and thus elements that are the same as those in the electro-optical device 100 of the foregoing first exemplary embodiment will be given the same reference signs, and will not be given detailed descriptions.

As illustrated in FIG. 12, the electro-optical device 200 of this embodiment is a self-luminous display device in which an element substrate 210, which includes a plurality of organic EL elements 30 and the color filter 36, and a transmissive opposing substrate 40, are disposed opposing each other, and are affixed to each other, interposing the adhesive 41.

In the element substrate 210, each of the plurality of pixels P arranged in the display region E1 includes the three sub pixels 18B, 18G, and 18R. Each of the sub pixels 18B, 18G, and 18R has an organic EL element 30, which includes the light-emission functional layer 32 formed between the pixel electrode 31 and the opposing electrode 33. The light-emission functional layer 32 and the opposing electrode 33 are formed across the display region E1, and are sealed by the sealing layer 34.

The color filter 36 is formed on the sealing layer 34, in the display region E1. The color filter 36 is configured including the blue coloring layers 36B, the green coloring layers 36G, and the red coloring layers 36R, which are formed corresponding to the sub pixels 18B, 18G, and 18R.

The frame-shaped dummy CF region E4 is provided on the sealing layer 34, in a position surrounding the display region E1, and the red coloring layer 36R is formed as the dummy CF in the dummy CF region E4. Furthermore, the similarly frame-shaped light-shielding portion 36S (light-shielding region E3) is provided surrounding the dummy CF region E4. The light-shielding portion 36S is formed by laminating the coloring layers 36G, 36B, and 36R, which have different colors, in that order. The average thickness of the coloring layers 36G is approximately 1 μm, and the average thickness of the coloring layers 36B and the coloring layers 36R is approximately 2 μm.

A first overcoat (OC) layer 51 is formed to cover the coloring layers 36B, 36G, and 36R in the display region E1 and the coloring layer 36R in the dummy CF region E4. Furthermore, a second overcoat (OC) layer 52 is formed through patterning, on the first overcoat (OC) layer 51, in positions overlapping, when viewed in plan view, with the coloring layers 36B and the coloring layers 36R arranged in the Y direction. In other words, the overcoat (OC) layer 50 according to this embodiment includes the first OC layer 51, formed across the display region E1 and the dummy CF region E4, and the second OC layer 52, which is formed having stripe shapes extending in the Y direction for each pixel P.

In other words, a plurality of grooves 52a, serving as protrusions and recesses in a stripe pattern extending in the Y direction, are formed in the surface of the color filter 36, in the element substrate 210, that is affixed to the adhesive 41, the grooves 52a being formed by the first OC layer 51 and the second OC layer 52 formed through patterning. As illustrated in FIG. 13, the grooves 52a are formed in positions overlapping with the coloring layers 36G in the color filter 36. The thickness of the first OC layer 51 on the color filter 36 is, for example, 1.5 µm, from the standpoint of covering the color filter 36 across the display region E1 and ensuring flatness. The thickness of the second OC layer 52 on the first OC layer 51 is thinner than the thickness of the first OC layer 51 at, for example, 1 µm, to regulate the depth of the grooves 52a.

The method of manufacturing the electro-optical device 200 is basically configured same as the method of manufacturing the electro-optical device 100 of the foregoing first exemplary embodiment, with the overcoat layer formation process (step S4) according to this embodiment including a process of forming the transmissive first OC layer 51 covering the color filter 36, and a process of forming the second OC layer 52 on the first OC layer 51, extending in the Y direction serving as the first direction. The first OC layer 51 and the second OC layer 52 are both formed through photolithography, using a transmissive photosensitive resin material.

According to the electro-optical device 200 and the method of manufacturing the electro-optical device 200 of the second exemplary embodiment, the following effects can be achieved.

(1) Regardless of how the thicknesses of the three coloring layers 36B, 36G, and 36R constituting the color filter 36 are set, the plurality of grooves 52a, serving as protrusions and recesses in a stripe pattern extending in the Y direction, are formed by the first OC layer 51 and the second OC layer 52 formed through patterning, on the surface of the color filter 36 that is affixed to the adhesive 41. In other words, even if the thicknesses of the three coloring layers 36B, 36G, and 36R are different and complex level differences are produced on the color filter 36, the color filter 36 is covered by the first OC layer 51, and it is thus difficult for unevenness in the application of the adhesive 41 to arise in the process of affixing the element substrate 210 and the opposing substrate 40. Additionally, the adhesive 41 spreads out along the plurality of grooves 52a, which extend in the Y direction serving as the first direction and which have no level differences in their base parts, and it is therefore difficult for bubbles to form in the grooves 52a. In other words, an electro-optical device 200 in which bubbles that affect the display do not easily form, and a method of manufacturing the electro-optical device 200, can be provided.

(2) The first OC layer 51 and the second OC layer 52 are laminated, in addition to the coloring layer 36R serving as the dummy CF, in the dummy CF region E4 between the light-shielding region E3 and the display region E1, and the height of those layers on the sealing layer 34 is approximately 4.5 µm. Accordingly, level differences between the light-shielding portion 36S and the color filter 36 can be reduced even more than in the configuration of the foregoing first exemplary embodiment. Additionally, in the process of affixing the element substrate 210 and the opposing substrate 40 using the adhesive 41, the adhesive 41 easily passes over the light-shielding portion 36S, and a situation in which the substrates are affixed with bubbles present between the light-shielding portion 36S, which is the highest part on the sealing layer 34, and the color filter 36, can be suppressed.

Because the color filter 36 is covered by the first OC layer 51, level differences pertaining to the setting of the thicknesses of the coloring layers 36B, 36G, and 36R do not affect the affixing process, and thus the direction in which the second OC layer 52 formed on the first OC layer 51 extends is not limited to the Y direction, and may be the X direction instead.

Third Exemplary Embodiment

Figure 14:
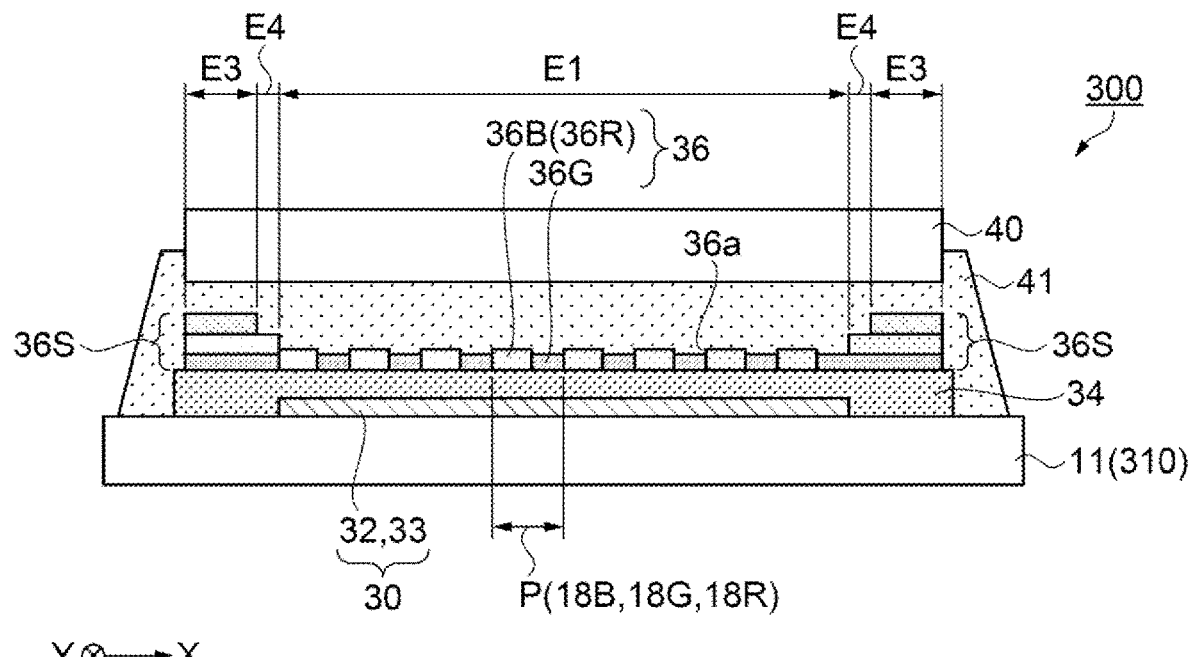
FIG. 14 is a schematic cross-sectional view illustrating the structure of an electro-optical device according to a third exemplary embodiment.
Figure 15:
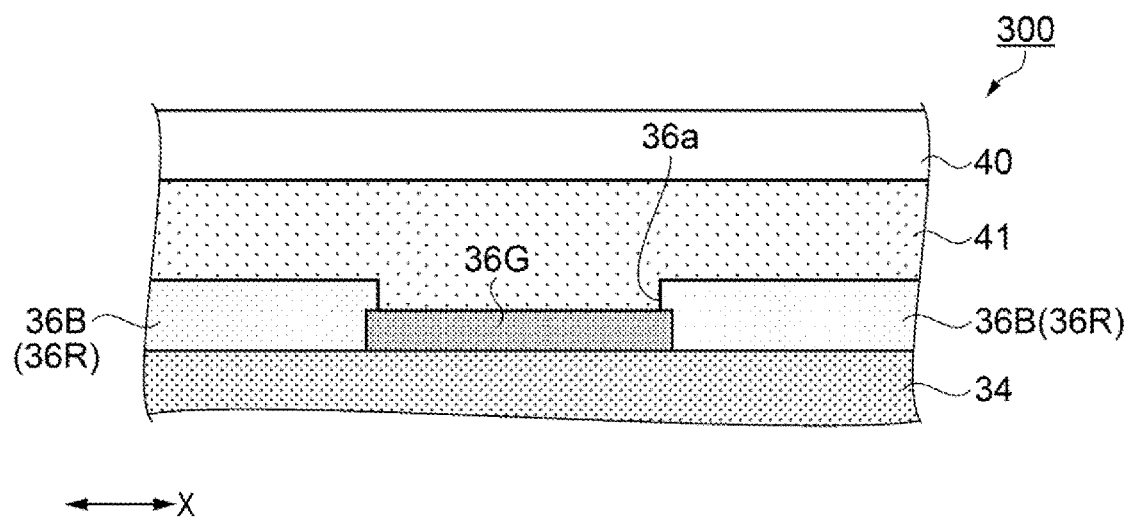
FIG. 15 is an enlarged cross-sectional view illustrating the structure of a color filter in the electro-optical device according to the third exemplary embodiment.

Next, an electro-optical device, and a method of manufacturing the electro-optical device, according to a third exemplary embodiment will be described with reference to FIGS. 14 and 15. FIG. 14 is a schematic cross-sectional view illustrating the structure of the electro-optical device according to the third exemplary embodiment, and FIG. 15 is an enlarged cross-sectional view illustrating the structure of a color filter in the electro-optical device according to the third exemplary embodiment. Note that FIG. 14 is a schematic cross-sectional view corresponding to FIG. 6, described in the foregoing first exemplary embodiment.

An electro-optical device 300 of the third exemplary embodiment differs from the electro-optical device 100 of the foregoing first exemplary embodiment in that the overcoat layer 50 is omitted. The rest of the configuration is the same, and thus elements that are the same as those in the electro-optical device 100 of the foregoing first exemplary embodiment will be given the same reference signs, and will not be given detailed descriptions.

As illustrated in FIG. 14, the electro-optical device 300 of this embodiment is a self-luminous display device in which an element substrate 310, which includes a plurality of organic EL elements 30 and the color filter 36, and a transmissive opposing substrate 40, are disposed opposing each other, and are affixed to each other, interposing the adhesive 41.

In the element substrate 310, each of the plurality of pixels P arranged in the display region E1 includes the three sub pixels 18B, 18G, and 18R. Each of the sub pixels 18B, 18G, and 18R has an organic EL element 30, which includes the light-emission functional layer 32 formed between the pixel electrode 31 and the opposing electrode 33. The light-emission functional layer 32 and the opposing electrode 33 are formed across the display region E1, and are sealed by the sealing layer 34.

The color filter 36 is formed on the sealing layer 34, in the display region E1. The color filter 36 is configured including the blue coloring layers 36B, the green coloring layers 36G, and the red coloring layers 36R, which are formed corresponding to the sub pixels 18B, 18G, and 18R.

The frame-shaped dummy CF region E4 is provided in a position surrounding the display region E1 on the sealing layer 34, and the green coloring layer 36G and the blue coloring layer 36B are laminated in the dummy CF region E4 as the dummy CF. Furthermore, the similarly frame-shaped light-shielding portion 36S (light-shielding region E3) is provided surrounding the dummy CF region E4. The light-shielding portion 36S is formed by laminating the coloring layers 36G, 36B, and 36R, which have different colors, in that order. The coloring layer 36G formed in the light-shielding region E3 and the coloring layer 36G formed in the dummy CF region E4 are connected. Likewise, the coloring layer 36B formed in the light-shielding region E3 and the coloring layer 36B formed in the dummy CF region E4 are connected. Note that the average thickness of the coloring layers 36G is approximately 1 µm, and the average thickness of the coloring layers 36B and the coloring layers 36R is approximately 2 µm. The arrangement of the coloring layers 36B, 36G, and 36R in the pixels P is the same as in the above-described first exemplary embodiment. In other words, the coloring layers 36B are disposed on the sealing layer 34 independently for the sub pixels 18B, and the coloring layers 36R are disposed independently for the sub pixels 18R. The green coloring layers 36G are disposed in stripe shapes corresponding to a plurality of sub pixels 18G arranged in the Y direction.

In other words, a plurality of grooves 36a, serving as protrusions and recesses in a stripe pattern extending in the Y direction, are formed on the surface of the color filter 36, in the element substrate 310, that is affixed to the adhesive 41, the grooves 36a being formed by the color filter 36. As illustrated in FIG. 15, the grooves 36a are formed by the coloring layers 36G and the coloring layers 36B (the coloring layers 36R) in the color filter 36 having different thicknesses.

The method of manufacturing the electro-optical device 300 omits the overcoat layer formation process (step S4) from the method of manufacturing the electro-optical device 100 of the foregoing first exemplary embodiment; additionally, in the color filter formation process (step S3) of this embodiment, the coloring layers 36B, 36G, and 36R are formed in the display region E1 corresponding to the sub pixels 18B, 18G, and 18R, and the coloring layer 36G and coloring layer 36B are formed in a frame shape across the light-shielding region E3 and the dummy CF region E4. Furthermore, the light-shielding portion 36S is formed by laminating the coloring layer 36R in a frame shape on the coloring layer 36B in the light-shielding region E3.

According to the electro-optical device 300 and the method of manufacturing the electro-optical device 300 of the third exemplary embodiment, the following effects can be achieved.

(1) In the color filter 36 on the sealing layer 34, the coloring layers 36B (coloring layers 36R) and the coloring layers 36G adjacent in the X direction serving as the second direction are given different thicknesses, and the coloring layers 36B (the coloring layers 36R) are made thinner than the coloring layers 36G, to form the grooves 36a extending in the Y direction on the coloring layers 36G. In other words, the plurality of grooves 36a, serving as protrusions and recesses in a stripe pattern, are formed in the surface of the color filter 36 that is affixed to the adhesive 41. In the process of affixing the element substrate 310 and the opposing substrate 40, the adhesive 41 spreads out along the grooves 36a, which extend in the Y direction serving as the first direction and which have no level differences in their base parts, and it is therefore difficult for bubbles to form in the grooves 36a. In other words, an electro-optical device 300 in which bubbles that affect the display do not easily form, and a method of manufacturing the electro-optical device 300, can be provided.

(2) In the dummy CF region E4 between the light-shielding region E3 and the display region E1, the coloring layer 36B is formed in addition to the coloring layer 36G as the dummy CF, and the height of the coloring layer 36B on the sealing layer 34 is approximately 3 µm. Accordingly, level differences between the light-shielding portion 36S and the color filter 36 can be reduced, in the same manner as in the foregoing first exemplary embodiment. As such, when affixing the element substrate 310 and the opposing substrate 40 using the adhesive 41, a situation in which the substrates are affixed with bubbles present between the light-shielding portion 36S, which is the highest part on the sealing layer 34, and the color filter 36, can be suppressed.

The pixels P of the electro-optical device 300 according to the third exemplary embodiment described above are, as in the electro-optical device 100 of the foregoing first exemplary embodiment, configured so that the sub pixels 18B (the coloring layers 36B) and the sub pixels 18R (the coloring layers 36R) are arranged in the Y direction serving as the first direction, and the sub pixels 18G (the coloring layers 36G) are arranged in the X direction, serving as the second direction, with respect to the sub pixels 18B (the coloring layers 36B) and the sub pixels 18R (the coloring layers 36R). However, the configuration is not limited thereto. For example, the configuration may be such that the sub pixels 18B (the coloring layers 36B) and the sub pixels 18R (the coloring layers 36R) are arranged in the X direction serving as the first direction, and the sub pixels 18G (the coloring layers 36G) are arranged in the Y direction, serving as the second direction, with respect to the sub pixels 18B (the coloring layers 36B) and the sub pixels 18R (the coloring layers 36R). In this case, the configuration is such that the plurality of grooves 36a, extending in the X direction and serving as protrusions and recesses in a stripe pattern, are provided in the adhesive surface of the color filter 36. In other words, the direction in which the plurality of grooves 36a, serving as the protrusions and recesses in a stripe pattern, extend is not limited to the Y direction, and may be the X direction instead.

Fourth Exemplary Embodiment

Electronic Apparatus

Figure 16:
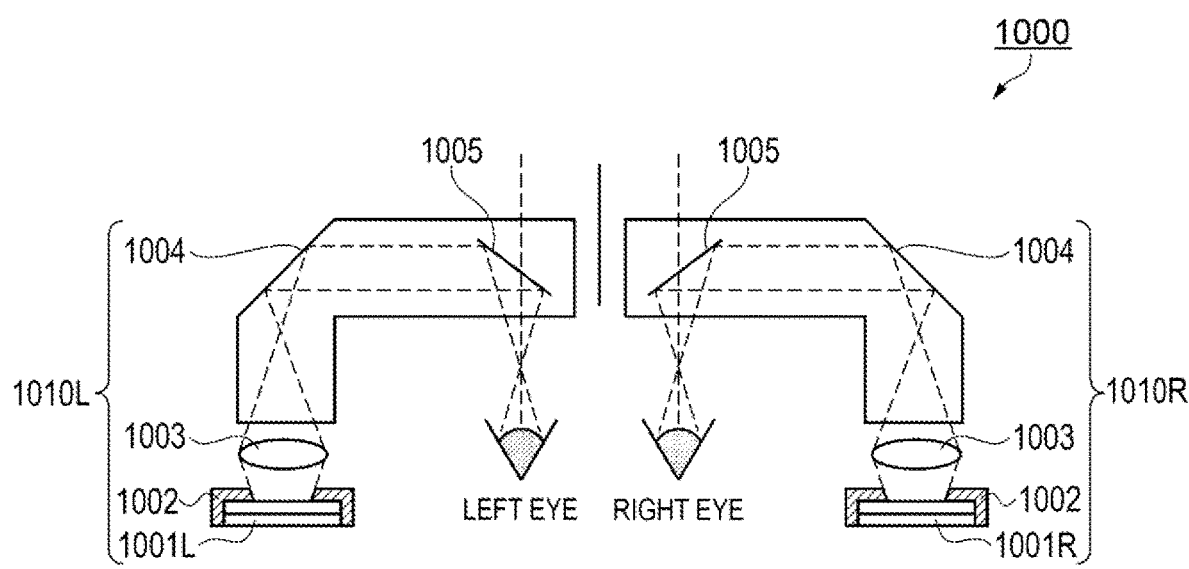
FIG. 16 is a schematic diagram illustrating the structure of a head-mounted display serving as an electronic apparatus according to a fourth exemplary embodiment.

Next, a head-mounted display (HMD) serving as an example of an electronic apparatus in which the electro-optical device of this embodiment is applied in a display unit will be described with reference to FIG. 16. FIG. 16 is a schematic diagram illustrating the configuration of the head-mounted display serving as the electronic apparatus.

A head-mounted display (HMD) 1000 includes a pair of optical units 1010L and 1010R for displaying information, corresponding to left and right eyes; a mounting part (not illustrated) for mounting the pair of optical units 1010L and 1010R on the head area of a user; a power source unit and a control unit (not shown), and the like. Here, the pair of optical units 1010L and 1010R are configured to be horizontally symmetrical, and thus the optical unit 1010R, configured for the right eye, will be described as an example.

The optical unit 1010R includes a display unit 1001R, a frame-shaped case part 1002, a focusing optical system 1003, and a light guide 1004 bent into an L shape. A half mirror layer 1005 is provided in the light guide 1004. In the optical unit 1010R, display light emitted from the display unit 1001R is guided to the right eye by entering the light guide 1004 through the focusing optical system 1003 and being reflected by the half mirror layer 1005. The display light (image) projected onto the half mirror layer 1005 is a virtual image. Accordingly, the user can visually recognize both the display (the virtual image) by the display unit 1001R and the outside world beyond the half mirror layer 1005. In other words, the HMD 1000 is a transmissive (see-through) projection-type display device.

The light guide 1004 is configured by combining rod lenses, and forms a rod integrator. The focusing optical system 1003 and the display unit 1001R are arranged on the side of the light guide 1004 where light enters, and the configuration is such that the display light focused by the focusing optical system 1003 is received by the rod lenses. Additionally, the half mirror layer 1005 of the light guide 1004 has an angle that reflects light beams, which are focused by the focusing optical system 1003 and then fully reflected and transmitted within the rod lenses, toward the right eye.

The display unit 1001R can display a display signal transmitted from the control unit in a display region as image information such as text, and video. The displayed image information is converted from an actual image into a virtual image by the focusing optical system 1003. The self-luminous electro-optical device 100 of the above-described first exemplary embodiment is applied in the display unit 1001R of this embodiment. The frame-shaped case part 1002 is provided on the focusing optical system 1003 side of the display unit 1001R, surrounding the display region, so that light emitted from parts aside from the display region of the display unit 1001R is not focused by the focusing optical system 1003 and therefore does not affect the display.

As described above, the optical unit 1010L for the left eye includes a display unit 1001L in which the electro-optical device 100 of the above-described first exemplary embodiment is applied, and the configuration and functions of the optical unit 1010L are the same as those of the optical unit 1010R for the right eye.

According to this embodiment, the self-luminous electro-optical device 100 is applied in the display units 1001L and 1001R, and thus an illumination device such as a backlight is unnecessary, unlike with applying non-luminous type liquid crystal devices. It is therefore possible to provide a see-through type HMD 1000 which is both small and light and which has an attractive display.

Note that the HMD 1000 in which the electro-optical device 100 of the above-described first exemplary embodiment is applied is not limited to a configuration including the pair of optical units 1010L and 1010R corresponding to both eyes, and the configuration may instead include only the one optical unit 1010R, for example. The HMD is furthermore not limited to a see-through type, and may instead be an immersive type in which the display is viewed in a state where the outside light is shielded.

Furthermore, the electro-optical device 200 of the above-described second exemplary embodiment or the electro-optical device 300 of the above-described third exemplary embodiment may be applied in the display units 1001L and 1001R.

Note that the invention is not limited to the exemplary embodiment described above, and the exemplary embodiment described above can be variously changed and modified. Modified examples are described below.

First Modified Example

Figure 17:
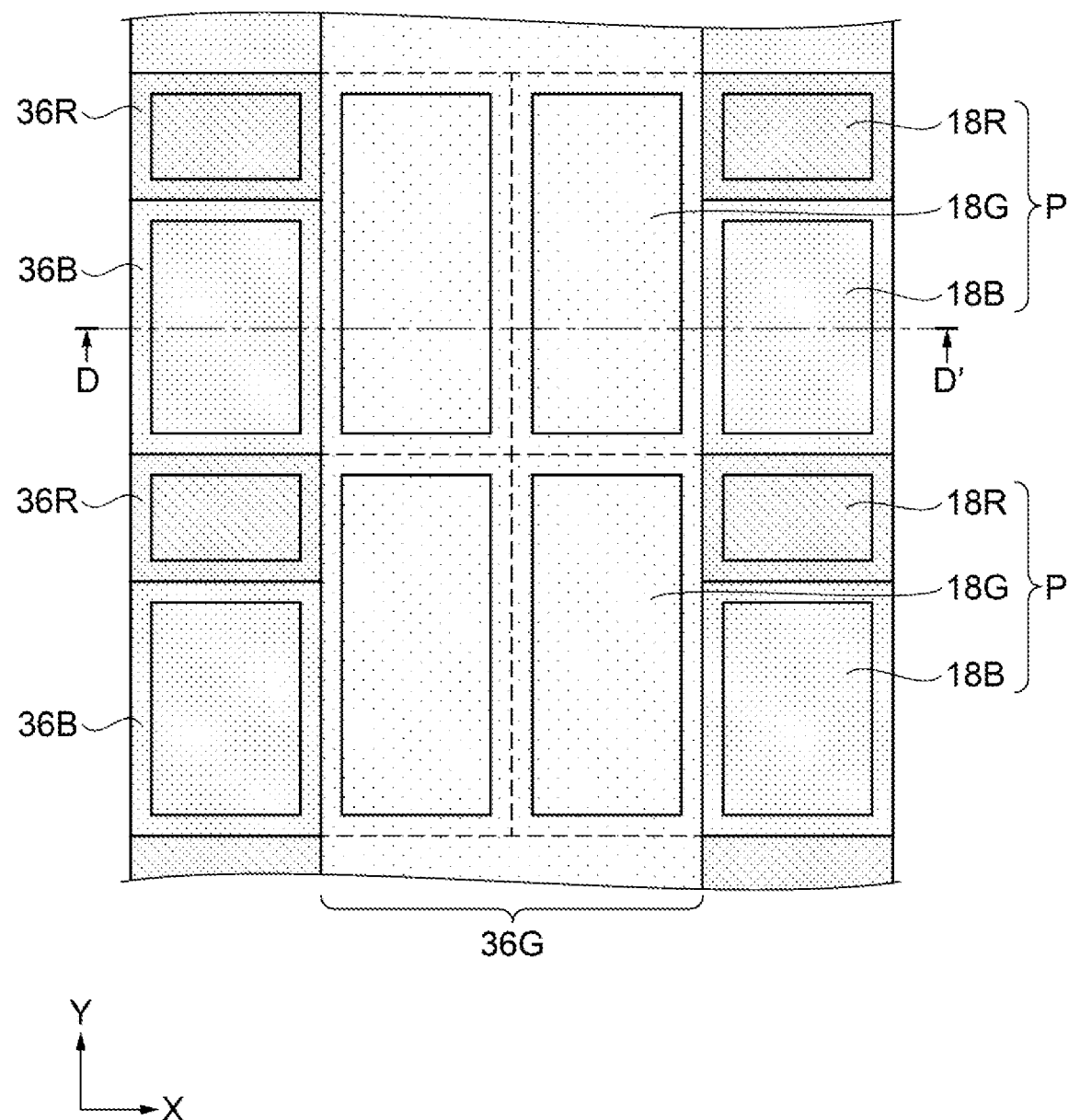
FIG. 17 is a plan view schematically illustrating the arrangement of sub pixels and a color filter according to a first modified example.
Figure 18:
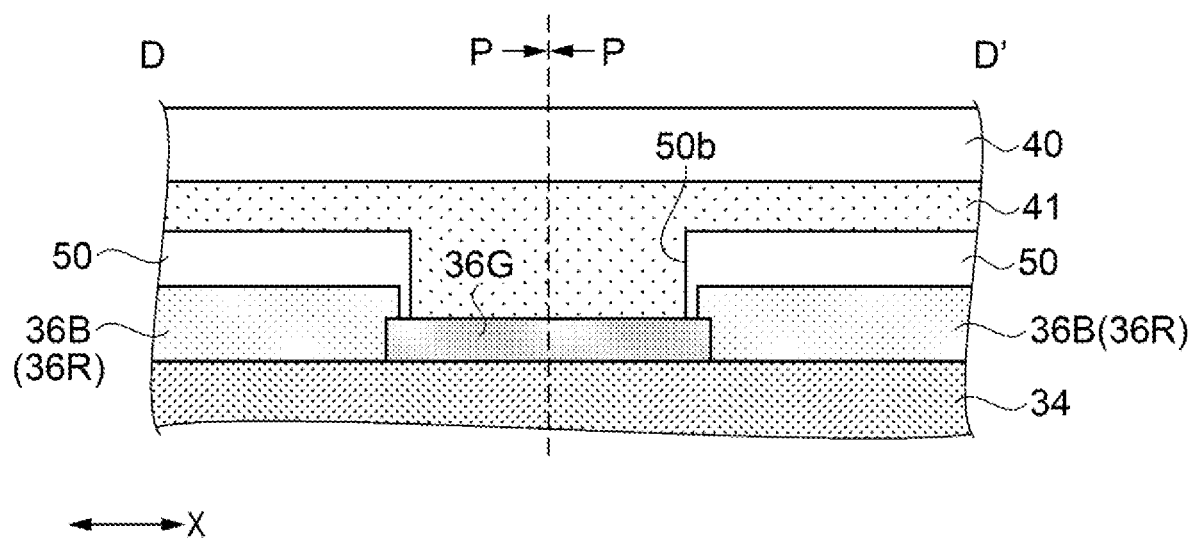
FIG. 18 is a schematic cross-sectional view illustrating the structure of a color filter and an overcoat layer, taken along line D-D' from FIG. 17.

The planar arrangement of the sub pixels 18B, 18G, and 18R in the pixels P and the color filter 36 corresponding to these sub pixels is not limited to the arrangement illustrated in FIG. 3, described in the foregoing first exemplary embodiment. FIG. 17 is a plan view schematically illustrating the arrangement of sub pixels and a color filter according to a first modified example, and FIG. 18 is a schematic cross-sectional view illustrating the structure of the color filter and an overcoat layer, taken along line D-D' from FIG. 17.

As illustrated in FIG. 17, in the first modified example, pixels P adjacent in the X direction are arranged so that the sub pixel 18G of one of the pixels P is adjacent to the sub pixel 18G of the other pixel P in the X direction. The green coloring layers 36G are disposed in stripe shapes corresponding to two columns' worth of sub pixels 18G arranged in the Y direction. Accordingly, as illustrated in FIG. 18, forming the OC layer 50 through patterning to overlap with the coloring layers 36B and the coloring layers 36R forms grooves 50b, which span two pixels P adjacent in the X direction and which extend in the Y direction. In other words, the grooves 50b, which are wider than the grooves 50a according to the above-described first exemplary embodiment, are formed. As such, during the process for affixing the element substrate 10 to the opposing substrate 40, the adhesive 41 spreads out along the wide grooves 50b, and it is difficult for bubbles to form in the grooves 50b. Note that as described in the foregoing first exemplary embodiment, the arrangement of the sub pixels 18B, 18G, and 18R in the pixels P is not limited to the arrangement described here, and a configuration is also possible in which the grooves 50b of the above-described first modified example, obtained by patterning the OC layer 50, extend in the X direction.

Second Modified Example

Figure 19:
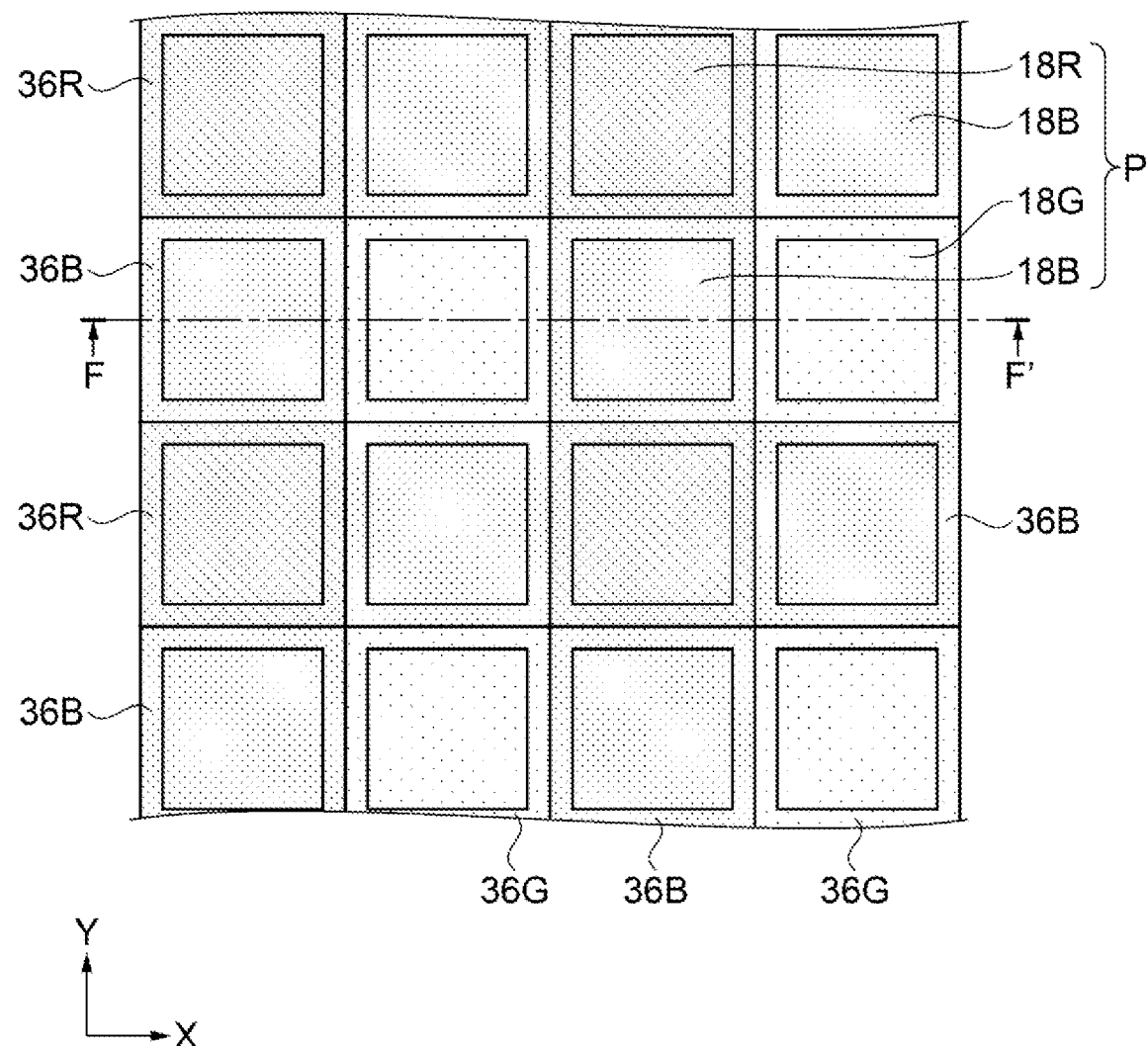
FIG. 19 is a plan view schematically illustrating the arrangement of sub pixels and a color filter according to a second modified example.
Figure 20:
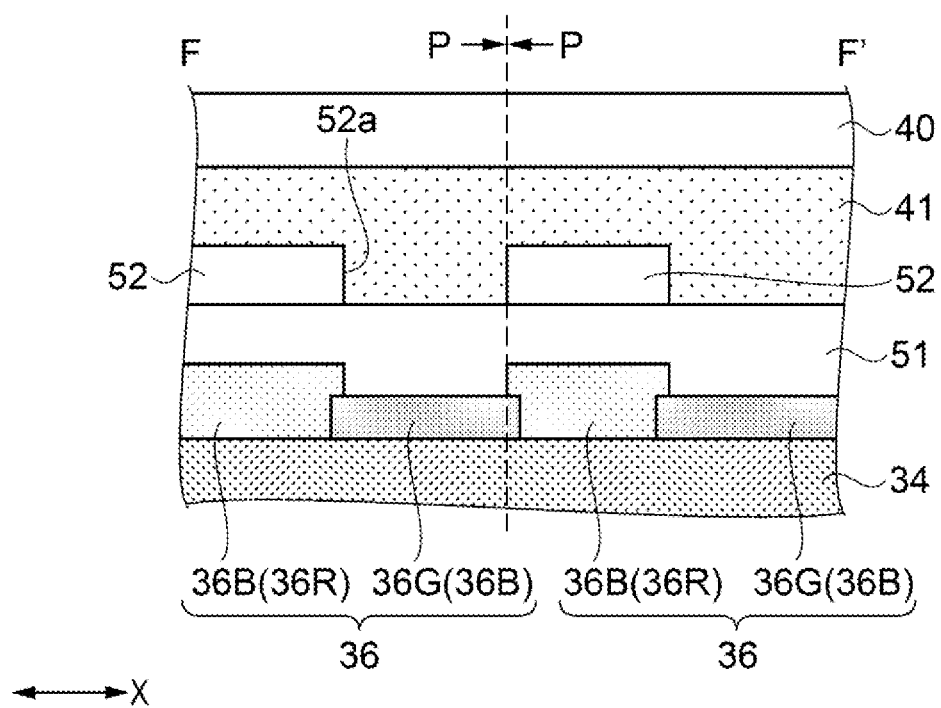
FIG. 20 is a schematic cross-sectional view illustrating the structure of a color filter and an overcoat layer, taken along line F-F' from FIG. 19.

The planar arrangement of the sub pixels 18B, 18G, and 18R in the pixels P and the color filter 36 corresponding to these sub pixels is not limited to the arrangement illustrated in FIG. 3, described in the foregoing first exemplary embodiment. FIG. 19 is a plan view schematically illustrating the arrangement of sub pixels and a color filter according to a second modified example, and FIG. 20 is a schematic cross-sectional view illustrating the structure of the color filter and an overcoat layer, taken along line F-F' from FIG. 19.

As illustrated in FIG. 19, in the second modified example, each pixel P includes two sub pixels 18B, one sub pixel 18G, and one sub pixel 18R, for example. In the pixel P, a sub pixel 18B and the sub pixel 18R are arranged in the Y direction. The sub pixel 18G is arranged adjacent to a sub pixel 18B in the X direction. The other sub pixel 18B is arranged adjacent to the sub pixel 18R in the X direction. The openings for the sub pixels 18B, 18G, and 18R are the same size, but as two sub pixels 18B are used in each pixel P, the region from which blue light is emitted is substantially larger. The coloring layers 36B, 36G, and 36R in the color filter 36 are arranged independently, corresponding to this arrangement of the sub pixels 18B, 18G, and 18R. With this arrangement for the coloring layers 36B, 36G, and 36R, in a case where each of the coloring layers are given different thicknesses, complex level differences will arise in the color filter 36 within the pixels P. As illustrated in FIG. 20, in the second modified example, the first OC layer 51 is first formed to cover the color filter 36, after which the second OC layer 52 is formed on the first OC layer 51 through patterning in positions overlapping with the coloring layers 36B and the coloring layers 36R, for example, when viewed in plan view, in the same manner as in the second exemplary embodiment. As a result, the plurality of grooves 52a, serving as protrusions and recesses in a stripe pattern extending in the Y direction, are formed on the color filter 36, in positions overlapping with the coloring layers 36G and the coloring layers 36B when viewed in plan view. Accordingly, in the process of affixing the element substrate and the opposing substrate 40 in the second modified example, the adhesive 41 spreads out along the plurality of grooves 52a, and it is difficult for bubbles to form in the grooves 52a. Note that the pixel P is not limited to including the three sub pixels 18B, 18G, and 18R, and may, for example, include a sub pixel 18Y for yellow (Y) in addition to blue (B), green (G), and red (R). Furthermore, even if the pixel P includes a total of four sub pixels 18, the direction in which the plurality of grooves 52a formed on the color filter 36 extend is not limited to the Y direction, and may be the X direction instead, as described in the foregoing second exemplary embodiment.

Third Modified Example

In the above-described second exemplary embodiment, the second OC layer 52 is formed on the first OC layer 51 through patterning, in positions overlapping with the coloring layers 36B and the coloring layers 36R arranged in the Y direction, when viewed in plan view. However, the method of forming the second OC layer 52 is not limited thereto. Because the first OC layer 51 is formed covering the color filter 36, it is difficult for differences in the thicknesses of the coloring layers 36B, 36G, and 36R in the color filter 36 to have an effect on the affixing process. Thus, the direction in which the second OC layer 52 is formed as stripes is not limited to the Y direction, and may be the X direction instead. Additionally, the stripe-shaped second OC layer 52 is not limited to being formed for each of the pixels P, and the stripe-shaped second OC layer 52 having desired widths with desired gaps may be formed on the first OC layer 51.

Fourth Modified Example

The electronic apparatus in which the electro-optical devices of the above-described embodiments is applied is not limited to the head-mounted display (HMD) of the above-described fourth exemplary embodiment. For example, the electro-optical device can be favorably used in the display unit of an electronic viewfinder in a digital camera or the like, a head-up display, a mobile information terminal, and the like.

The following describes details that can be derived from the embodiments.

An electro-optical device according to an aspect of the invention includes, a first substrate including a plurality of light-emitting elements and a color filter provided corresponding to the plurality of light-emitting elements, and a second substrate being a transmissive substrate and disposed facing the first substrate with an adhesive provided between the first substrate and the second substrate, wherein an adhesive surface of the color filter of the first substrate is provided with protrusions and recesses in a stripe pattern.

According to the configuration of this aspect, when affixing the first substrate and the second substrate, the adhesive spreads out along the protrusions and recesses in a stripe pattern at the adhesive surface of the color filter. Accordingly, even if the coloring layers constituting the color filter have, for example, different thicknesses from color to color and complex level differences arise as a result, problems such as unevenness in the application of the adhesive, bubbles forming in the adhesive, and the like can be reduced. In other words, an electro-optical device in which bubbles that affect the display do not easily form can be provided.

Preferably, the above-described electro-optical device further including an overcoat layer provided on the color filter, the overcoat layer being a transmissive layer, and the overcoat layer is provided with protrusions and recesses in a stripe pattern.

According to this configuration, providing the overcoat layer on the color filter makes it difficult for the device to be affected by level differences produced by differences in the thicknesses of the coloring layers. In other words, an electro-optical device in which bubbles that affect the display form even less easily can be provided.

Preferably, in the above-described electro-optical device, the color filter includes coloring layers of at least three colors, and the overcoat layer covers a coloring layer arranged in a first direction among the coloring layers of at least three colors.

According to this configuration, the protrusions and recesses in a stripe pattern can be realized by the overcoat layer in each pixel provided with the coloring layers of at least three colors.

Additionally, in the above-described electro-optical device, the coloring layer arranged in the first direction may include coloring layers having different thicknesses.

According to this configuration, the coloring layers of different thicknesses that are arranged in the first direction are covered by the overcoat layer, and as a result, the coloring layers having different thicknesses has no effect when adhering the first substrate and the second substrate.

Additionally, in the above-described electro-optical device, a coloring layer arranged in a second direction intersecting with the first direction may have a thickness different from that of the coloring layer arranged in the first direction.

According to this configuration, the coloring layer arranged in the second direction has a thickness different from that of the coloring layer arranged in the first direction, and thus protrusions and recesses in a stripe pattern extending in the first direction can be configured at the adhesive surface of the color filter.

Preferably, in the above-described electro-optical device, the overcoat layer includes a first overcoat layer covering the color filter, and a second overcoat layer extending in a first direction on the first overcoat layer, and the protrusions and recesses in a stripe pattern are formed by the first overcoat layer and the second overcoat layer.

According to this configuration, the color filter is covered by the first overcoat layer, and thus even if the coloring layers constituting the color filter have, for example, different thicknesses from color to color, the first substrate and the second substrate can be affixed to each other, interposing the adhesive without being affected by level differences between the coloring layers.

Additionally, in the above-described electro-optical device, the color filter may include coloring layers of at least three colors, and the protrusions and recesses in a stripe pattern may be formed by making thicknesses of two coloring layers of different colors among the coloring layers of at least three colors, different from each other.

According to this configuration, the protrusions and recesses in a stripe pattern are provided by giving two coloring layers of different colors different thicknesses at the adhesive surface of the color filter. Accordingly, when affixing the first substrate and the second substrate using the adhesive, the adhesive spreads out along the protrusions and recesses, which makes it possible to affix the first substrate and the second substrate in a state where bubbles do not easily form.

Preferably, in the above-described electro-optical device, the color filter includes coloring layers of at least three colors, and a light-shielding portion formed by laminating the coloring layers of at least three colors is provided in a position surrounding a light-emitting region, the light-emitting region being a region in which the plurality of light-emitting elements are disposed.

According to this configuration, the light-shielding portion formed by laminating the coloring layers of at least three colors is provided in a position surrounding the light-emitting region, and thus light leaking from the light-emitting region can be shielded by the light-shielding portion, making it possible to provide an electro-optical device capable of an attractive display.

A method of manufacturing an electro-optical device according to an aspect of the invention is a method of manufacturing an electro-optical device including a plurality of light-emitting elements and a color filter, the method including, forming a sealing layer sealing the plurality of light-emitting elements across a light-emitting region of a first substrate, the light-emitting region being a region in which the plurality of light-emitting elements are disposed, forming a color filter by forming coloring layers of at least three colors on the sealing layer, the coloring layers corresponding to the plurality of light-emitting elements, forming an overcoat layer covering a coloring layer arranged in a first direction among the coloring layers of at least three colors, the overcoat layer being a transmissive layer, and affixing the first substrate to a second substrate using an adhesive, the first substrate being a substrate on which the overcoat layer is formed and the second substrate being a transmissive substrate.

According to this method, when forming the overcoat layer, the protrusions and recesses in a stripe pattern extending in the first direction can be formed at the adhesive surface of the color filter. As such, during the affixing, the adhesive can spread out along the protrusions and recesses in a stripe pattern, and thus the first substrate and the second substrate can be affixed to each other, without being affected by level differences caused by the thicknesses of the coloring layers in the color filter, while reducing problems such as unevenness in the application of the adhesive and bubbles forming in the adhesive. In other words, a method of manufacturing an electro-optical device in which bubbles that affect the display do not easily form can be provided.

A method of manufacturing an electro-optical device according to another aspect of the invention is a method of manufacturing an electro-optical device including a plurality of light-emitting elements and a color filter, the method including, forming a sealing layer sealing the plurality of light-emitting elements across a light-emitting region of a first substrate, the light-emitting region being a region in which the plurality of light-emitting elements are disposed, forming a color filter by forming coloring layers of at least three colors on the sealing layer, the coloring layers corresponding to the plurality of light-emitting elements, forming a first overcoat layer covering the color filter, with the first overcoat layer being a transmissive layer, and forming a second overcoat layer extending in the first direction on the first overcoat layer, with the second overcoat layer being a transmissive layer, and affixing the first substrate to a second substrate using an adhesive, the first substrate being a substrate provided with the first overcoat layer and the second overcoat layer the second substrate being a transmissive substrate.

According to the method of this other aspect, during the forming of the overcoat layer, the first overcoat layer is formed covering the color filter, and the second overcoat layer is furthermore formed on the first overcoat layer. Accordingly, the protrusions and recesses in a stripe pattern can be formed at the adhesive surface of the color filter by the second overcoat layer extending in the first direction. As such, during the affixing, the adhesive can spread out along the protrusions and recesses in a stripe pattern, and thus the first substrate and the second substrate can be affixed to each other, without being affected by level differences caused by the thicknesses of the coloring layers in the color filter, while reducing problems such as unevenness in the application of the adhesive and bubbles forming in the adhesive. In other words, a method of manufacturing an electro-optical device in which bubbles that affect the display do not easily form can be provided.

A method of manufacturing an electro-optical device according to another aspect of the invention is a method of manufacturing an electro-optical device including a plurality of light-emitting elements and a color filter, the method including, forming a sealing layer sealing the plurality of light-emitting elements across a light-emitting region of a first substrate, the light-emitting region being a region in which the plurality of light-emitting elements are disposed, forming a color filter by forming coloring layers of at least three colors on the sealing layer, the coloring layers corresponding to the plurality of light-emitting elements, and affixing the first substrate to a second substrate using an adhesive, the first substrate being a substrate on which the color filter is formed, with the second substrate being a transmissive substrate, wherein in the forming of the color filter, a first coloring layer and a second coloring layer among the coloring layers of at least three colors are formed to be arranged in a first direction, and a third coloring layer having a different thickness from the first coloring layer and the second coloring layer is formed and arranged adjacent to the first coloring layer and the second coloring layer in a second direction intersecting with the first direction.

According to the method of this other aspect, during the forming of the color filter, the third coloring layer is formed adjacent in the second direction to, and having a different thickness with respect to the first coloring layer and the second coloring layer, which are arranged in the first direction. As such, the protrusions and recesses in a stripe pattern extending in the first direction are formed on the color filter. As such, during the affixing, the adhesive can spread out along the protrusions and recesses in a stripe pattern, and thus the first substrate and the second substrate can be affixed to each other, without being affected by level differences caused by the thicknesses of the coloring layers in the color filter, while reducing problems such as unevenness in the application of the adhesive and bubbles forming in the adhesive. In other words, a method of manufacturing an electro-optical device in which bubbles that affect the display do not easily form can be provided.

Preferably, in the above-described method of manufacturing an electro-optical device, in the forming of the color filter, a light-shielding portion is formed by laminating the coloring layers of at least three colors in a position surrounding the light-emitting region.

According to this method, the light-shielding portion formed by layering the coloring layers of at least three colors is formed in a position surrounding the light-emitting region, and thus light leaking from the light-emitting region can be shielded by the light-shielding portion, making it possible to manufacture an electro-optical device capable of an attractive display.

Preferably, in the above-described method of manufacturing an electro-optical device, in the forming of the color filter, a light-shielding portion is formed by layering the coloring layers of at least three colors in a position surrounding the light-emitting region and in the forming of the overcoat layer, the overcoat layer is formed on an inner side of the light-shielding portion.

According to this method, a level difference arising between the light-shielding portion and the color filter provided in the light-emitting region can be reduced by the overcoat layer. Accordingly, during the affixing, the adhesive can easily pass over the light-shielding portion and spread out, which makes it possible to reduce situations where bubbles form in the adhesive at the level difference between the light-shielding portion and the color filter.

An electronic apparatus according to an aspect of the invention including the above-described electro-optical device.

According to the configuration of this aspect, a self-luminous electro-optical device in which it is at least difficult for bubbles to arise in the light-emitting region is included, and thus an electronic apparatus capable of an attractive display can be provided.

The entire disclosure of Japanese Patent Application No. 2018-036220, filed Mar. 1, 2018 is expressly incorporated by reference herein.

What is claimed is:

1. An electro-optical device comprising:
   a first substrate including a plurality of light-emitting elements and a color filter provided corresponding to the plurality of light-emitting elements;
   a second substrate being a transmissive substrate and disposed facing the first substrate with an adhesive provided between the first substrate and the second substrate, wherein an adhesive surface of the color filter of the first substrate is provided with protrusions and recesses in a stripe pattern; and
   an overcoat layer provided on the color filter, the overcoat layer being a light-transmissive layer, wherein the overcoat layer is provided with the protrusions and recesses in a stripe pattern.

2. The electro-optical device according to claim 1, wherein
   the color filter includes coloring layers of at least three colors; and
   the overcoat layer covers a coloring layer arranged in a first direction among the coloring layers of at least three colors.

3. The electro-optical device according to claim 1, wherein
   the color filter includes coloring layers of at least three colors;
   the overcoat layer covers coloring layers arranged in a first direction among the coloring layers of at least three colors; and
   the coloring layers arranged in the first direction are coloring layers having different thicknesses.

4. The electro-optical device according to claim 2, wherein
   a coloring layer arranged in a second direction intersecting with the first direction has a thickness different from that of the coloring layer arranged in the first direction.

5. The electro-optical device according to claim 3, wherein
   a coloring layer arranged in a second direction intersecting with the first direction has a thickness different from that of the coloring layers arranged in the first direction.

6. The electro-optical device according to claim 1, wherein
   the overcoat layer includes a first overcoat layer covering the color filter, and a second overcoat layer extending in a first direction on the first overcoat layer; and
   the protrusions and recesses in a stripe pattern are formed by the first overcoat layer and the second overcoat layer.

7. The electro-optical device according to claim 1, wherein
   the color filter includes coloring layers of at least three colors, and
   the protrusions and recesses in a stripe pattern are formed by making thicknesses of two coloring layers of different colors, among the coloring layers of at least three colors, different from each other.

8. The electro-optical device according to claim 1, wherein
   the color filter includes coloring layers of at least three colors, and
   a light-shielding portion formed by laminating the coloring layers of at least three colors is provided in a position surrounding a light-emitting region in which the plurality of light-emitting elements are disposed.

9. An electronic apparatus comprising the electro-optical device according to claim 1.

* * * * *